(12) United States Patent
Pfeuffer et al.

(10) Patent No.: US 12,295,192 B2
(45) Date of Patent: May 6, 2025

(54) METHOD FOR PRODUCING A COMPONENT, AND COMPONENT

(71) Applicant: OSRAM Opto Semiconductors GmbH, Regensburg (DE)

(72) Inventors: Alexander F. Pfeuffer, Regensburg (DE); Tobias Berthold, Regensburg (DE); Lutz Höppel, Alteglofsheim (DE); Tobias Meyer, Kelheim (DE); Korbinian Perzlmaier, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 704 days.

(21) Appl. No.: 17/609,256

(22) PCT Filed: May 6, 2020

(86) PCT No.: PCT/EP2020/062585
§ 371 (c)(1),
(2) Date: Nov. 5, 2021

(87) PCT Pub. No.: WO2020/225304
PCT Pub. Date: Nov. 12, 2020

(65) Prior Publication Data
US 2022/0238773 A1    Jul. 28, 2022

(30) Foreign Application Priority Data

May 7, 2019    (DE) .......................... 102019111816.6

(51) Int. Cl.
*H01L 25/00*    (2006.01)
*H01L 25/04*    (2023.01)
(Continued)

(52) U.S. Cl.
CPC ......... *H10H 20/857* (2025.01); *H01L 25/042* (2013.01); *H01L 25/0753* (2013.01);
(Continued)

(58) Field of Classification Search
None
See application file for complete search history.

(56) References Cited

U.S. PATENT DOCUMENTS 8,564,969 B2    10/2013    Oppermann et al.
10,224,393 B2    3/2019    Günther et al.
(Continued)

FOREIGN PATENT DOCUMENTS

CN    103370779 A    10/2013
CN    105934834 A    9/2016
(Continued)

OTHER PUBLICATIONS

Meitl, Matthew A., et al., " Emissive Displays with Transfer-Printed Microscale Inorganic LED's," Book 1: Session 19: Micro Light-Emitting-Diode Displays, Invited Paper, SID 2017 Digest, Jun. 2, 2017, 7 pages.

*Primary Examiner* — Bradley Smith
(74) *Attorney, Agent, or Firm* — Slater Matsil, LLP

(57) ABSTRACT

In an embodiment a method for producing a component having a carrier and at least one component part electrically conductively connected to the carrier and mechanically fixed to the carrier by an electrically insulating bonding layer includes providing the carrier having a connection layer, wherein the bonding layer is disposed on the carrier and has at least one opening, wherein a connection surface of the connection layer is exposed, and wherein the bonding layer projects vertically beyond the exposed connection surface or vice versa, applying the component part having a contact layer on the carrier in such that, in top view of the carrier,
(Continued)

an exposed contact surface of the contact layer covers the opening and the connection surface located therein, wherein the exposed contact surface is spaced apart from the exposed connection surface by a vertical distance and reducing the vertical distance by changing a volume of the bonding layer such that the exposed contact surface and the exposed connection surface are brought together, such that they are directly adjacent to each other and such that a direct electrical contact is formed between the contact layer and the connection layer.

20 Claims, 12 Drawing Sheets

(51) Int. Cl.
*H01L 25/075* (2006.01)
*H10F 71/00* (2025.01)
*H10F 77/00* (2025.01)
*H10H 20/857* (2025.01)
*H10H 20/01* (2025.01)

(52) U.S. Cl.
CPC ........... *H10F 71/00* (2025.01); *H10F 77/933* (2025.01); *H10H 20/0364* (2025.01)

(56) References Cited

U.S. PATENT DOCUMENTS

2016/0336307 A1* 11/2016 Herrmann ............. H01L 33/486
2017/0133566 A1 5/2017 Herrmann
2017/0148777 A1 5/2017 Bono et al.
2019/0088633 A1 3/2019 Tao et al.
2019/0318957 A1* 10/2019 Godet ................... H01L 21/311

FOREIGN PATENT DOCUMENTS

| | | |
|---|---|---|
| DE | 102004055677 A1 | 6/2006 |
| DE | 102009009828 A1 | 9/2010 |
| DE | 102014100773 A1 | 7/2015 |
| EP | 0704947 A1 | 4/1996 |
| WO | 2018234121 A1 | 12/2018 |

* cited by examiner

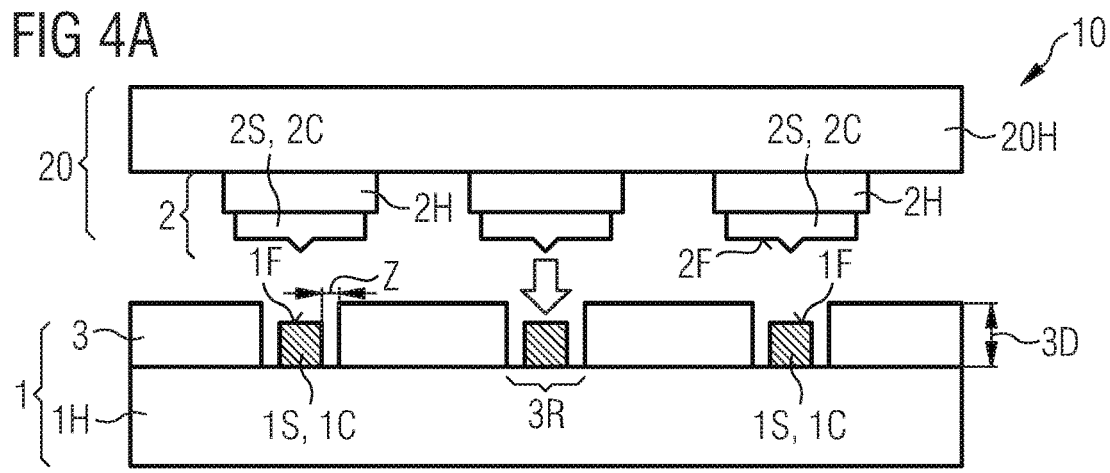
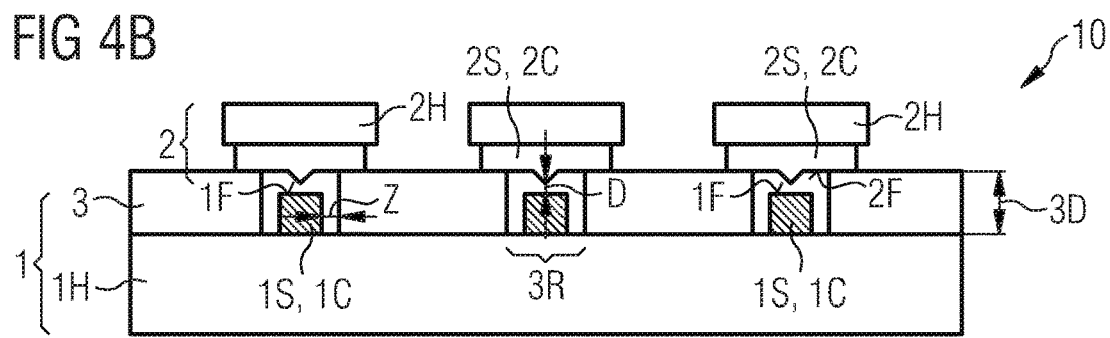
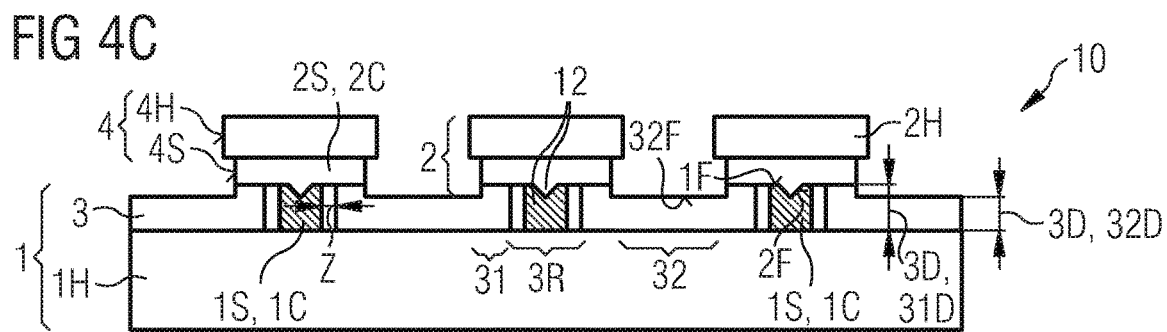
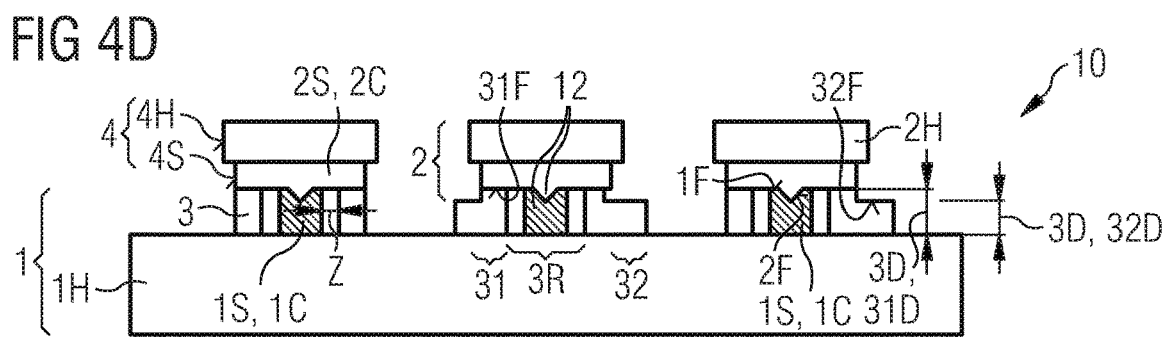

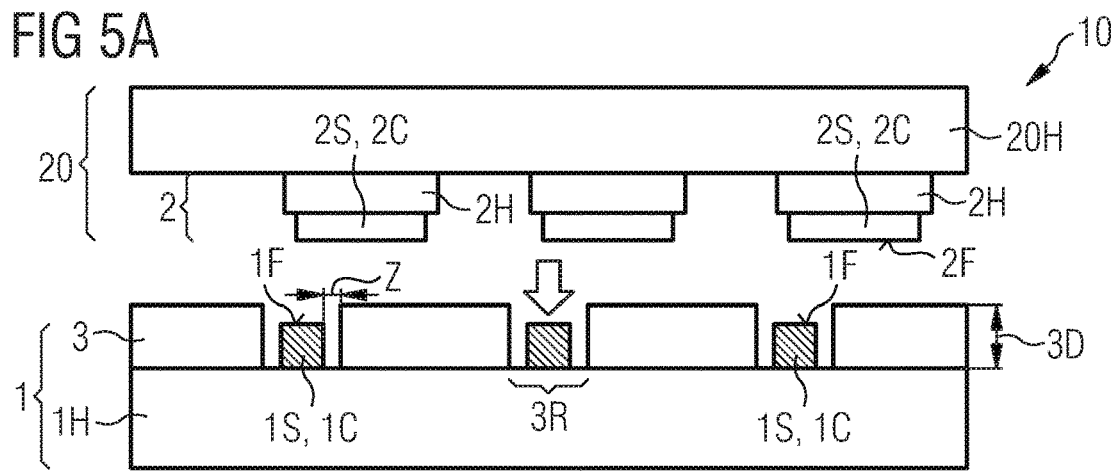
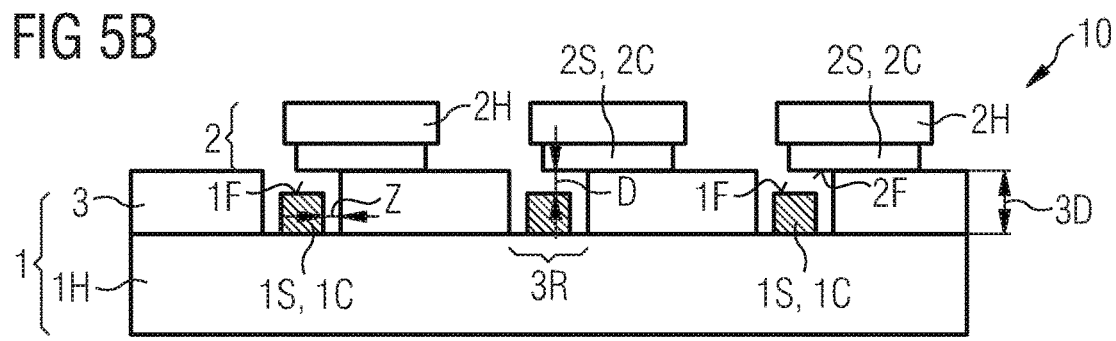
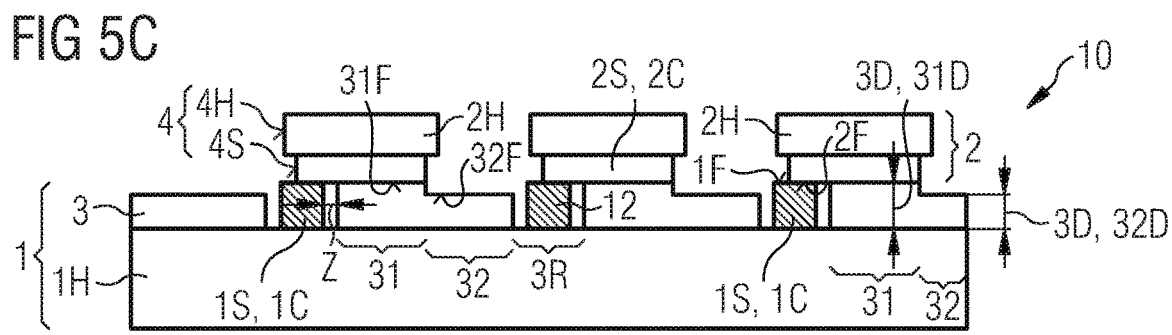
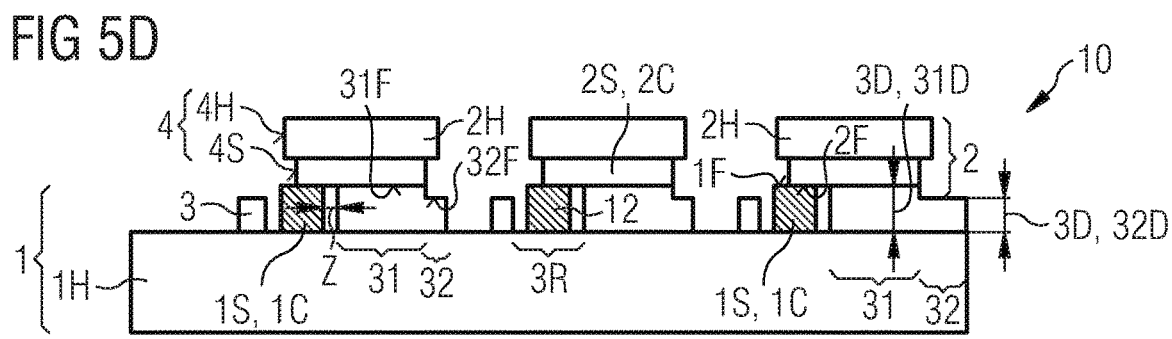

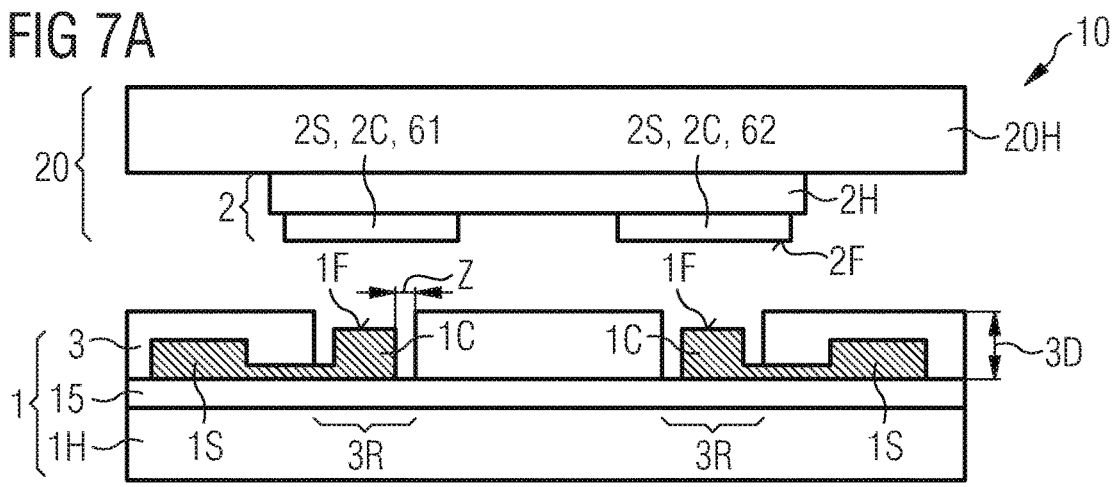
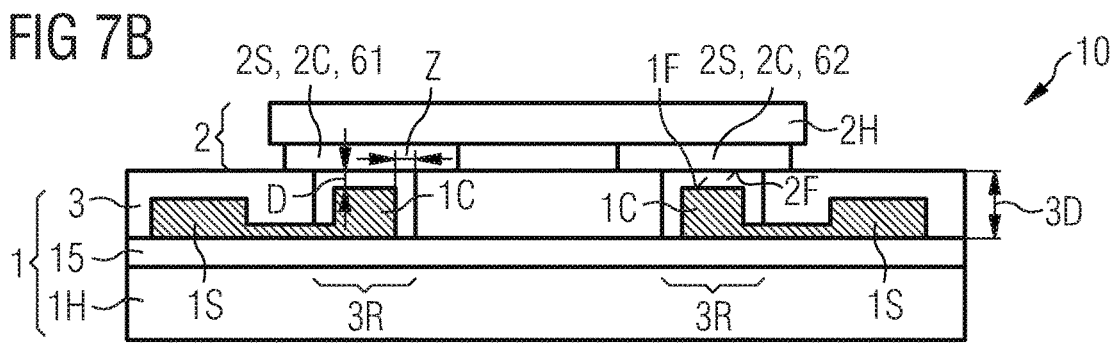
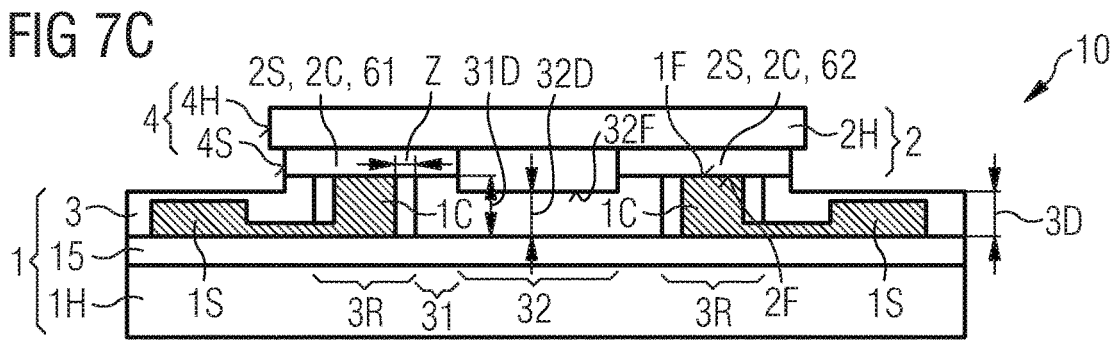
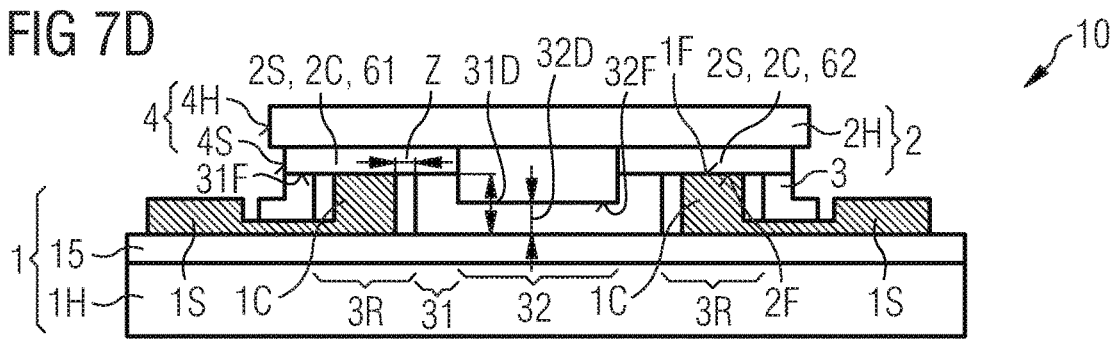

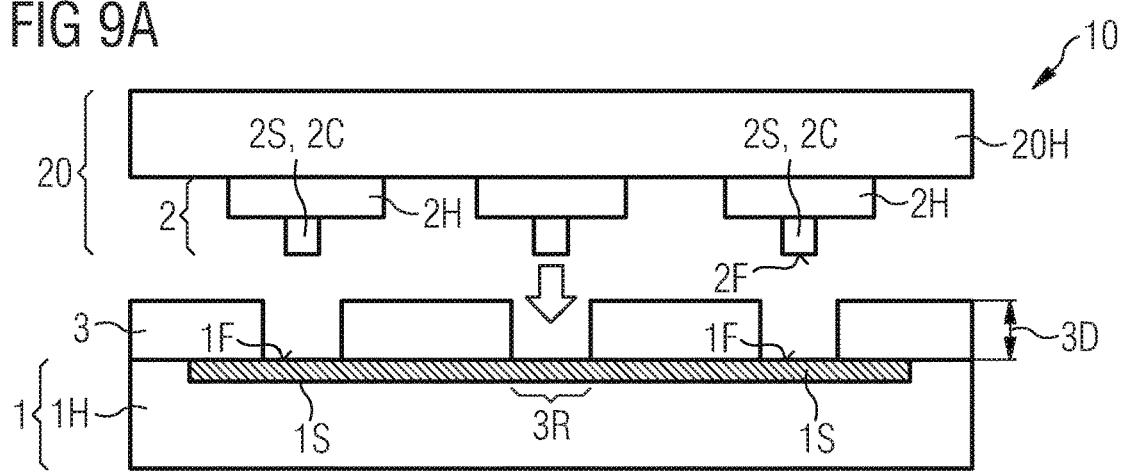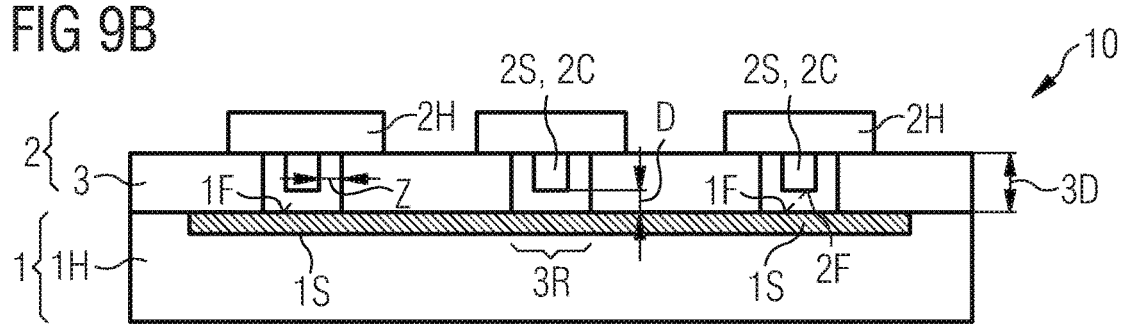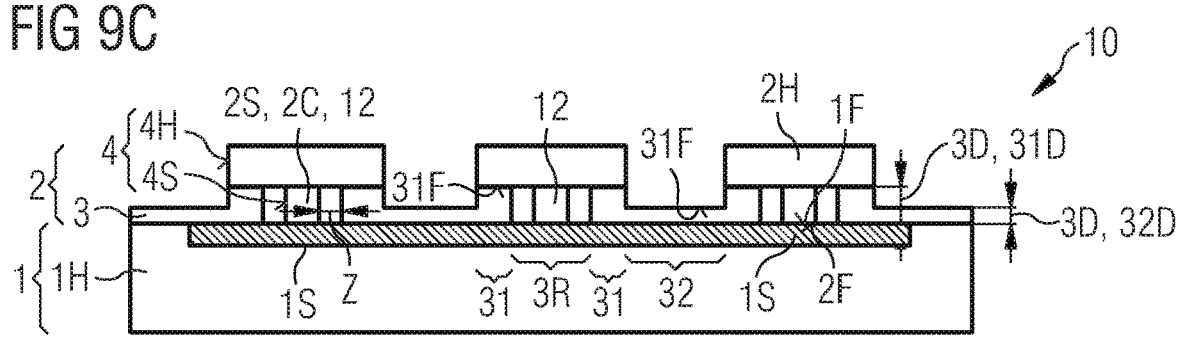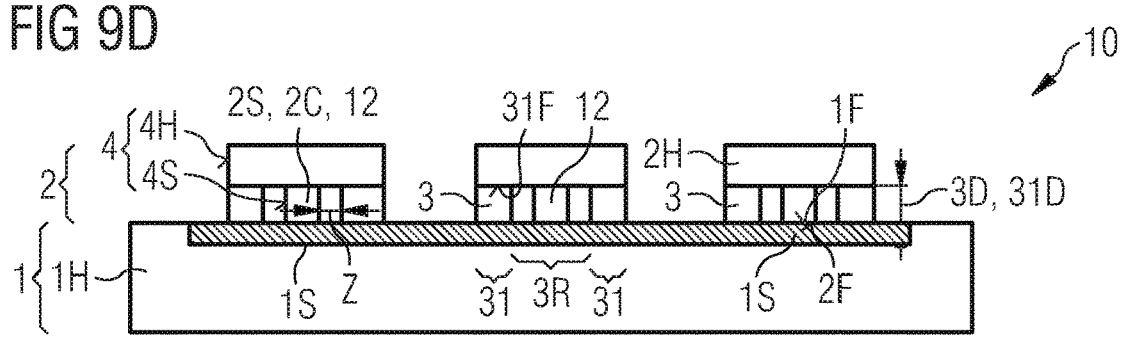

METHOD FOR PRODUCING A COMPONENT, AND COMPONENT

This patent application is a national phase filing under section 371 of PCT/EP2020/062585, filed May 6, 2020, which claims the priority of German patent application 102019111816.6, filed May 7, 2019, each of which is incorporated herein by reference in its entirety.

TECHNICAL FIELD

A method for producing a component is specified. Furthermore, a component is specified.

BACKGROUND

The formation of a reliable electrical connection in addition to a stable mechanical connection in a joining plane is quite challenging if, for example, an adhesive layer having a layer thickness of less than 5 µm, less than 3 µm, less than 1 µm or less than 0.2 µm is to be used, since the adhesive layer of such a low layer thickness usually lacks electrically conductive fillers. However, should the adhesive layer have electrically conductive fillers, the adhesive layer often has much greater layer thicknesses. In particular, the use of thicker adhesive layers is not particularly suitable for component parts having a lateral dimension of a few micrometers, since the use of such adhesive layers does not eliminate the risk with respect to tilting of the component parts in the adhesive layer. In addition, the risk of short circuits increases when using electrically conductive adhesive layers.

SUMMARY

Embodiments provide a reliable and cost-efficient method for producing a component. Further embodiments provide a component having a reliable electrical connection and a stable mechanical connection between a carrier and a component part of the component.

A method for producing a component comprising a carrier and at least one component part is provided, wherein the component part is electrically conductively connected to the carrier and is mechanically fixed to the carrier in particular by an electrically insulating bonding layer. In particular, the adhesive layer is free of an electrically conductive material, for instance free of electrically conductive fillers. For example, the adhesive layer is not configured to establish an electrical connection. Preferably, the mechanical connection is made spatially separate from the electrical connection. It is possible that the component comprises a plurality of component parts which are mechanically fixed to the common carrier and are electrically connected thereto.

A carrier is generally understood to mean a receiver structure that mechanically supports the component part or a plurality of component parts. The receiver structure may comprise electrical circuits, transistors, electrical conductors or other electrical structures, particularly those configured to make electrical contact with and control the component part or component parts. The carrier is, for example, a receiver carrier, for instance a semiconductor substrate, a Si-wafer optionally with through-vias, a printed circuit board with electrical tracks or a receiver with integrated circuits, transistors and/or other switching elements.

For example, the receiver structure is part of an electronic device or of a light source. The component parts may find application as detectors or light sources in general lighting, ambient lighting, interior or exterior lighting of vehicles, or in a headlight of a motor vehicle. It is also conceivable that the component comprising the carrier and the component parts may find application in electronic devices, mobile phones, touchpads, laser printers, cameras, recognition cameras, facial recognition cameras, displays or in other systems comprising LEDs, sensors, laser diodes and/or detectors.

According to at least one embodiment of the method, the carrier is provided with a connection layer. The bonding layer may be arranged on the carrier, in particular on a main body of the carrier. The bonding layer may be an adhesive layer. In particular, the bonding layer has at least one opening, in which a connection surface of the connection layer is exposed. The opening may have any shape, for example, the shape of a circle, a square, or the shape of an ellipse. For example, the bonding layer in the vicinity of the opening has the shape of a closed frame or of an open frame. It is possible that the bonding layer has a plurality of openings, in each of which a connection surface of the connection layer is exposed. In a vertical direction, the bonding layer may extend beyond the exposed connection surface or beyond the connection layer, for instance in a direction away from the main body of the carrier. However, conversely, it is also possible for the exposed connection surface or the connection column or the connection layer to protrude beyond the bonding layer, for instance in a direction away from the main body of the carrier. The bonding layer may be formed in a structured manner. For example, the bonding layer may have sub-regions that are laterally spaced apart from each other.

The connection layer is in particular part of a wiring structure of the carrier. The connection layer may be continuous or have a plurality of spatially separate sub-layers. The connection layer may have one connection column or a plurality of connection columns, wherein the exposed connection surface is formed, for example, by an exposed surface of the associated connection column. In particular, the connection surface is a metal surface.

A vertical direction is generally understood to mean a direction perpendicular to a main extension surface of the carrier, in particular of the main body of the carrier. A lateral direction, on the other hand, is understood to be a direction directed in particular parallel to the main extension surface of the carrier. The vertical direction and the lateral direction are transverse, for instance orthogonal to each other.

According to at least one embodiment of the method, the component part having a contact layer is attached to the carrier such that, in a top view of the carrier, an exposed contact surface of the contact layer covers the opening and the connection surface located therein. The exposed contact surface of the contact layer may partially or completely cover the opening and the connection surface. The exposed contact surface is for instance a metal surface, and may be an exposed surface of a contact column of the contact layer. In particular, the contact layer is part of a wiring structure configured to electrically contact the component part or component. The contact layer may include a plurality of laterally spaced openings or recesses. If the exposed connection surface or the connection column or the connection layer protrudes beyond the bonding layer, it is possible that the exposed connection surface or the connection column or the connection layer protrudes in places into one or several openings or recesses of the contact layer. Preferably, the connection layer remains spatially spaced apart from the contact layer so that an electrical connection between the connection layer and the contact layer is not yet established for the time being.

After the component part has been attached to the carrier, the bonding layer is in particular directly adjacent to the component part and directly adjacent to the carrier. In the region of the opening of the bonding layer, the exposed contact surface of the contact layer is spaced apart from the exposed connection surface of the connection layer, in particular by a vertical distance. In other words, the exposed contact surface is not directly adjacent to the exposed connection surface, but is spatially separated from the connection surface by an intermediate space, wherein the intermediate space may be filled with a gaseous medium, for instance with air. If the exposed connection surface or the connection column or the connection layer projects beyond the bonding layer, it is possible for the connection layer, for example for the connection column, to be surrounded in lateral directions by the contact layer in regions, in particular completely surrounded. The connection layer or the connection column may be spatially separated from the contact layer by a lateral intermediate space, wherein the lateral intermediate space may be filled with a gaseous medium, for example with air.

According to at least one embodiment of the method, the vertical distance between the contact surface and the connection surface is reduced. The reduction of the vertical distance may be achieved by changing the volume, for instance by reducing the volume of the bonding layer. For example, the volume of the bonding layer is shrunk in an annealing process, for instance in an oven. The increase in temperature may convert the bonding layer from, for example, a viscous, soft or pasty state to a solid state. This process may reduce the proportions of liquid, for instance of bonding agents in the bonding layer, resulting in reducing the volume and hence the vertical layer thickness of the bonding layer. Heating may also initiate a crosslinking reaction within the bonding layer, resulting in reducing the volume of the bonding layer. The reduction in the vertical spacing or volume of the bonding layer may alternatively or additionally be mechanically assisted, for instance by the application of external force. For example, the bonding layer may be compressed by the application of an external force.

In particular, the vertical distance is reduced by the change in volume of the bonding layer such that the exposed contact surface and the exposed connection surface are brought together, as a result of which they are directly adjacent to each other and a direct electrical contact is formed between the contact layer and the connection layer. An overlapping area between the connection surface and the contact surface forms, for example, an interface between the respective component part and the carrier, which may be smaller than 75%, preferably smaller than 50%, smaller than 25% or smaller than 10% of the total joining surface between the carrier and the respective component part. In particular, the interface is free of a material of the bonding layer or free of traces of a material of the bonding layer. For example, the interface may be a pure metal-to-metal surface, a pure metal-to-TCO surface, and/or a pure TCO-to-TCO surface (TCO: transparent conductive oxide).

According to at least one embodiment of the method, the component part comprises a semiconductor body having an optically active zone configured to generate or detect electromagnetic radiation. The component part is, for example, a light emitting diode. The semiconductor body may comprise a first semiconductor layer of a first type of charge carrier and a second semiconductor layer of a second type of charge carrier. The first semiconductor layer and the second semiconductor layer may be n-type and p-type, respectively, or vice versa. In particular, the active zone is disposed between the first semiconductor layer and the second semiconductor layer. For example, the active zone is a pn junction region. For example, the component part is a micro component part, for instance a μLED. The component part has a lateral extent that is, for example, between 1 μm and 1 mm inclusive, for instance between 10 μm and 1 mm inclusive, between 50 μm and 1 mm inclusive, or between 1 μm and 30 μm inclusive, between 10 μm and 100 μm inclusive, or between 30 μm 300 μm inclusive. The carrier may comprise electrical circuits configured to electrically contact or to drive the component part or component parts.

In at least one embodiment of the method for producing a component having a carrier and at least one component part which is electrically conductively connected to the carrier and is mechanically fixed to the carrier by an electrically insulating bonding layer, a carrier having a connection layer is provided. The bonding layer is arranged on the carrier and has at least one opening, in which a connection surface of the connection layer is exposed. In particular, the bonding layer extends in a vertical direction beyond the exposed connection surface. The component part having a contact layer is applied onto the carrier such that, in a plan view of the carrier, an exposed contact surface of the contact layer covers the opening and the connection surface located therein, wherein the exposed contact surface is spaced apart from the exposed connection surface by a vertical distance. Subsequently, the vertical distance is reduced by changing the volume of the bonding layer, resulting in bringing the exposed contact surface and the exposed connection surface together so that they are directly adjacent to each other and form a direct electrical contact between the contact layer and the connection layer.

In at least one embodiment of the method for producing a component having a carrier and at least one component part which is electrically conductively connected to the carrier and is mechanically fixed to the carrier by an electrically insulating bonding layer, a carrier having a connection layer is provided. The bonding layer is arranged on the carrier and has at least one opening, in which a connection surface of the connection layer is exposed. In particular, the bonding layer projects vertically beyond the exposed connection surface or vice versa. In particular, the latter means that the exposed connection surface of the connection layer or the connection layer or the connection column protrudes in a vertical direction beyond the bonding layer, for instance in a vertical direction away from the carrier or away from the main body of the carrier, respectively. The component part having a contact layer is applied onto the carrier such that, in a plan view of the carrier, an exposed contact surface of the contact layer covers the opening and the connection surface located, wherein the exposed contact surface is spaced apart from the exposed connection surface by a vertical distance. Subsequently, the vertical distance is reduced by changing the volume of the bonding layer, resulting in bringing the exposed contact surface and the exposed connection surface together so that they are directly adjacent to each other and form a direct electrical contact between the contact layer and the connection layer.

A reliable mechanical connection between the component part and the carrier is thus ensured by the electrically insulating bonding layer. The electrical connection between the component part and the carrier is formed by aligning the contact surface and the connection surface, i.e. by aligning the electrical contact points of the component part and of the carrier. The electrical connection and the mechanical connection between the component part and the carrier are thus spatially separated. By reducing the volume of the bonding layer, the contact surface and the connection surface are not only brought together but also pressed against each other, as a result of which a secure electrical connection is formed between the carrier and the component part. It is possible that the connection layer and the contact layer form a solder system. However, the mechanical adhesion between the connection layer and the contact layer may be less than the adhesion between the component part and the carrier directly caused by the bonding layer.

The spatial separation of the mechanical connection from the electrical connection minimizes the risk of short circuits, especially compared to cases where conductive materials for instance solder paste or bonding layer having electrically conductive fillers are used. Furthermore, since the bonding layer does not contain electrically conductive fillers, the bonding layer can be formed to be particularly thin. Expensive fillers for instance gold, silver, aluminum or other metals can be dispensed with. Furthermore, since the bonding layer includes at least one opening or a plurality of openings for electrically connecting the component part or component parts to the substrate, the bonding layer need not be interrupted by, for example, random or planned topography steps. Indeed, the formation of the opening or openings may be performed in a separate process prior to the attachment of the component part, such that the dimensions of the openings as well as the spacing between the openings may be formed in a targeted manner depending on the application of desired component parts.

According to at least one embodiment of the method, after the component part is attached and before the vertical distance is reduced, the bonding layer is directly adjacent to the component part and directly adjacent to the carrier. In particular, the bonding layer has an initial vertical layer thickness prior to the change in volume, which is reduced during the method, wherein the reduction of the vertical distance can be achieved by shrinking the vertical layer thickness of the bonding layer or by shrinking the volume of the bonding layer.

Prior to the reduction of the volume of the bonding layer, in particular prior to the shrinking process, the bonding layer is preferably swollen temporarily in order to increase the adhesiveness. The additional swelling of the adhesive layer can be affected by storing the carrier with the bonding layer arranged thereon in a solvent atmosphere. This increases the adhesiveness of the bonding layer and thus helps to increase the mechanical strength between the carrier and the component part. As the bonding layer is temporarily swollen, the volume of the bonding layer also briefly increases, resulting in greater shrinkage of the volume of the bonding layer and allowing a greater vertical distance between the connection surface and the contact surface to be overcome. In particular, the bonding layer is swollen before the component part is placed on the carrier.

According to at least one embodiment of the method, the bonding layer has a vertical layer thickness with a constant height in a vicinity of the contact layer before the change in volume. After the change in volume, the bonding layer has a reduced vertical layer thickness in the same vicinity of the contact layer, in particular with locally different heights. Here, the layer thickness of the bonding layer may be greater in an overlapping region of the bonding layer with the component part than in a region of bonding layer without overlap with the component part. Alternatively or additionally, the layer thickness in an overlapping region of the bonding layer with the contact layer may be greater than in a region of the bonding layer without overlap with the contact layer.

According to at least one embodiment of the method, the bonding layer has a surface which faces the component part, and is step-like in particular due to the locally different heights of the bonding layer. For example, the bonding layer has a partial surface that is directly adjacent to the component part and is a maximum vertical elevation of the bonding layer. Along the vertical direction away from the carrier, the bonding layer thus does not protrude beyond the component part. In particular, the component part, for instance a main body of the component part, is free of a lateral enclosure or free of a lateral covering by the bonding layer.

If the bonding layer adjoins both the contact layer and the main body of the component part, or if the contact layer projects into the opening of the bonding layer, the contact layer may be laterally enclosed by the bonding layer, at least in regions. In this context, it is possible for the contact layer to have a contact column or a plurality of contact columns which are located, at least in regions, in the opening of the bonding layer, wherein the contact column or the contact columns is/are spatially spaced apart from the bonding layer in the lateral direction.

According to at least one embodiment of the method, the bonding layer comprises or is formed from a photostructurable material. The photo-structurable material may be an adhesion promoting photoresist. In other words, the bonding layer may be formed from a photostructurable adhesion promoting material. In this case, the bonding layer may comprise a photostructurable ingredient that is detectable, in particular, in the finished component. The opening or plurality of openings may be formed by photo-structuring the bonding layer, that is, by photolithography.

According to at least one embodiment of the method, the exposed connection surface is formed by an exposed surface of a connection column. In particular, the connection column is arranged in the opening of the bonding layer. The connection column may be laterally spaced from the bonding layer prior to the change in volume of the bonding layer and may remain laterally spaced from the bonding layer after the change in volume of the bonding layer.

According to at least one embodiment of the method, the exposed contact surface is formed by an exposed surface of a contact column. In particular, the contact column protrudes into the opening of the bonding layer. The contact column may be laterally spaced from the bonding layer prior to the change in volume of the bonding layer, and may remain laterally spaced from the bonding layer after the change in volume of the bonding layer.

After the change in volume of the bonding layer, the connection column and the associated contact column are in particular directly adjacent to each other. For example, the connection column and the contact column form a through-contact extending along the vertical direction throughout the bonding layer. Since the contact column and the connection column may have different cross-sections, a surface of the through-contact may be in the form of a step at a transition zone between the contact column and the connection column. In lateral directions, the through-contact may be spaced from the bonding layer by, for example, an intermediate region. The intermediate region may be filled with a gaseous medium, for instance air. The component may have a plurality of such through-contacts, wherein the component part or the component parts is/are electrically conductively connected to the carrier via the through-contact/s. However, it is possible that such through-contact is formed exclusively by the connection column or exclusively by the contact column.

According to at least one embodiment of the method, the connection layer or the connection column protrudes in regions into a recess or into an opening of the contact layer. In lateral directions, the connection layer, for instance the connection column, may be enclosed by the contact layer in regions or completely. In particular, the exposed contact surface or the contact surfaces of the contact layer is/are formed by bottom surface or bottom surfaces of the recesses or of the openings of the contact layer. This design form of the connection layer and of the contact layer can also be apparent at the finished component part.

According to at least one embodiment of the method, a plurality of component parts are simultaneously applied onto the carrier. In particular, each component part comprises a contact layer having at least one contact surface. The bonding layer comprises a plurality of openings, in each of which a connection surface of the connection layer is freely accessible. For example, during a common method step for reducing the volume of the bonding layer, the component parts are electrically connected to the carrier.

In at least one embodiment of a component, it comprises a carrier, at least one component part and an electrically insulating bonding layer. The component part is mechanically attached to the carrier by the electrically insulating bonding layer. The carrier comprises a connection layer having a connection surface, wherein the bonding layer is arranged on the carrier and comprises at least one opening in which the connection surface of the connection layer is located. The component part comprises a contact layer having a contact surface, wherein, in a top view of the carrier, the contact surface covers the opening of the bonding layer and the connection surface of the connection layer located therein. The contact surface and the connection surface are directly adjacent to each other, resulting in a formation of a direct electrical contact between the contact layer and the connection layer, and as a result of which the component part is electrically conductively connected to the carrier.

In such a component, the electrical connection and the mechanical connection between the component part and the carrier are in particular locally separated. Using the electrically insulating bonding layer, the component part is mechanically fixed to the carrier. The bonding layer, which is for example an adhesive layer, may be structured such that no material of the bonding layer remains in the opening or in the openings of the bonding layer. In particular, the remaining regions of the bonding layer outside the openings are available for mechanical fixation. In this case, the layer thickness and the composition of the bonding layer can be selected in such a way that, after the solvents have been expelled and eventually after a crosslinking reaction, the conductive surfaces of the connection layer and of the contact layer are in direct contact. Since the bonding layer is in particular free of electrically conductive fillers, the bonding layer can be formed to be particularly thin. The local separation of the mechanical fixation from the electrical connection also reduces the risk of short circuits within the component.

According to at least one embodiment of the component, an interface between the contact layer and the connection layer is formed by an overlapping surface between the contact surface and the connection surface. The interface is in particular free of a material of the bonding layer or free of traces of a material of the bonding layer.

According to at least one embodiment of the component, the bonding layer extends exclusively in a vertical region which is located along the vertical direction at a height between the carrier and the component part. In particular, side surfaces of a main body of the component part are free from being covered by the bonding layer. Also, the main body of the component part may be free from a lateral enclosure by the bonding layer. In other words, the bonding layer in particular does not extend as far as to the vertical height of the component part. It is possible that the bonding layer does not have a single sub-region that extends beyond the contact layer of the component part in the direction away from the carrier. Globally, the bonding layer is thus in particular exclusively located at a vertical height between the carrier and the component part, for instance between the carrier and the main body of the component part. In particular, side surfaces of the component part are not, or at most partially, covered or laterally enclosed by the bonding layer at the side surfaces of the contact layer.

According to at least one embodiment of the component, the bonding layer has a surface which faces away from the carrier in an overlapping region with the component part, is directly adjacent to the component part and marks the highest vertical elevation of the bonding layer from the carrier.

According to at least one embodiment of the component, the bonding layer comprises, in a top view of the carrier, a first sub-region and a second sub-region directly adjacent to the first sub-region. The first sub-region has a first surface which faces away from the carrier, is in particular directly adjacent to the component part and is completely covered by the component part. The second sub-region has a second surface which faces away from the carrier, and is, for example not adjacent to the component part. A vertical distance between the first surface and a main body of the carrier is in particular greater than a vertical distance between the second surface and the main body of the carrier.

For example, the first sub-region has a greater layer thickness than the second sub-region. It is possible that the first sub-region has a lower material density than the second sub-region. However, the first sub-region and the second sub-region may be formed from the same material.

According to at least one embodiment of the component, the bonding layer has a layer thickness between 20 nm and 5 µm inclusive, between 20 nm and 2 µm inclusive, for example between 100 nm and 3 µm inclusive, for instance between 20 nm and 1 µm inclusive. In this sense, the bonding layer is a thin adhesion promoter layer.

According to at least one embodiment of the component, the component part is electrically conductively connected to the carrier via a through-contact. The through-contact comprises at least one sub-region of the contact surface and at least one sub-region of the connection surface, wherein the through-contact extends along the vertical direction throughout the bonding layer. These sub-regions are in particular inner or outer surfaces of the through-contact. The through-contact is spaced from the bonding layer in the lateral direction, in particular by an intermediate region. For example, the intermediate region is a cavity filled with a gaseous medium.

According to at least one embodiment of the component or of the method, the contact surface of the contact layer only partially covers the opening and the connection surface in top view. The component part or the component parts may be arranged offset on the bonding layer in such a way that the component part or the component parts each covers one of the openings only regionally. Thus, it is possible that the connection column is only partially covered by the associated contact column in top view, or vice versa. The contact regions of the component part or component parts are thus laterally displaced in a targeted manner.

According to at least one embodiment of the component or method, the contact between the contact layer and the connection layer is a re-melted contact connection, in particular a re-melted solder contact connection. The connection layer and/or the contact layer may comprise for instance a solder material, may be formed from a solder material or be coated with a solder material.

The method described above is particularly suitable for the production of a component described herein. The features described in connection with the component can therefore also be used for the method, and vice versa.

BRIEF DESCRIPTION OF THE DRAWINGS

Further preferred embodiments and further developments of the component as well as of the method will be apparent from the exemplary embodiments explained below:

FIGS. 3A, 3B, 3C, 3D, 4A, 4B, 4C, 4D, 5A, 5B, 5C, 5D, 6A, 6B, 6C, 6D, 7A, 7B, 7C, 7D, 8A, 8B, 8C, 8D, 9A, 9B, 9C and 9D show schematic representations of various method steps of further exemplary embodiments of a method for producing a component.

Figure 1A:
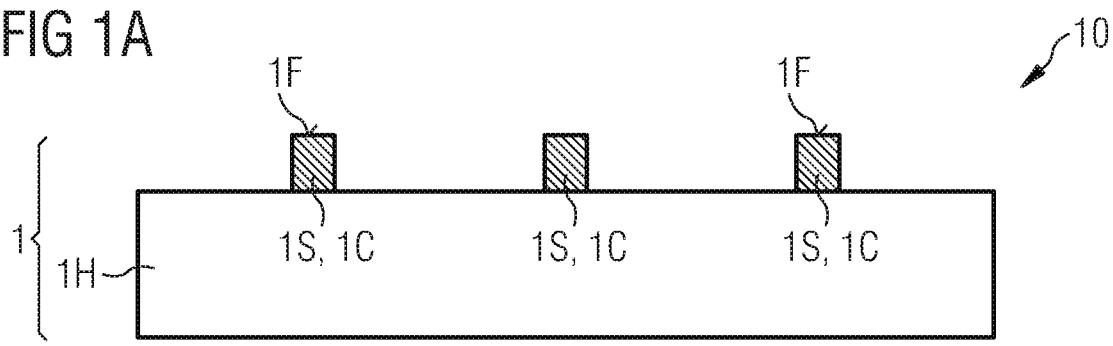
FIGS. 1A, 1B, 1C, 1D, 1E, and 1F show schematic illustrations of some method steps of a method for producing a component.

Identical, equivalent or equivalently acting elements are indicated with the same reference numerals in the figures. The figures are schematic illustrations and thus not necessarily true to scale. Comparatively small elements and particularly layer thicknesses can rather be illustrated exaggeratedly large for the purpose of better clarification.

DETAILED DESCRIPTION OF ILLUSTRATIVE EMBODIMENTS

FIG. 1A schematically illustrates a method step for producing a component 10. A carrier 1 is provided, which for example has a main body 1H. A connection layer 1S is disposed on the main body 1H. The connection layer 1S may be a patterned layer having a plurality of connection columns 1C. The connection columns 1C each have a surface 1F facing away from the main body 1H, wherein the surface 1F forms a connection surface 1F and is freely accessible as shown in FIG. 1A. The exposed connection surfaces 1F shown in FIG. 1A are in particular metal surfaces forming so-called connection pads of the carrier 1.

In a departure from FIG. 1A, depending on functionality, the carrier 1 may have a more complex sequence of current carrying and insulating layers which, for the sake of clarity, are not shown in FIG. 1A or in the following figures.

Figure 1B:
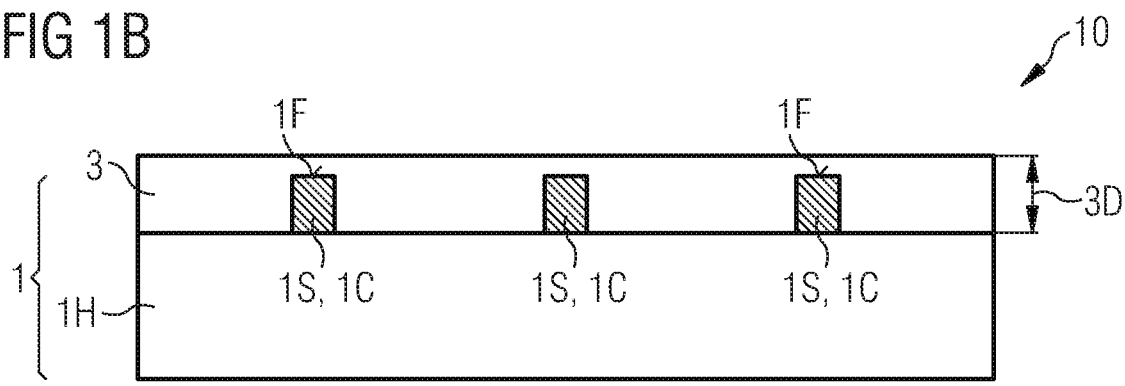

According to FIG. 1B, a bonding layer 3 is applied onto the carrier 1. In particular, the connection columns 1C having the exposed connection surfaces 1F are coated with a material of the bonding layer 3, for example with an insulating adhesive, for example a so-called spin-on process. In top view of the main body 1H, the bonding layer 3 initially completely covers the connection columns 1C and the connection surfaces 1F. In lateral directions, the bonding layer 3 may initially be directly adjacent to the connection columns 1C and the connection surfaces 1F. After the bonding layer 3 has been applied to the carrier 1, it has a vertical layer thickness 3D.

Figure 1C:
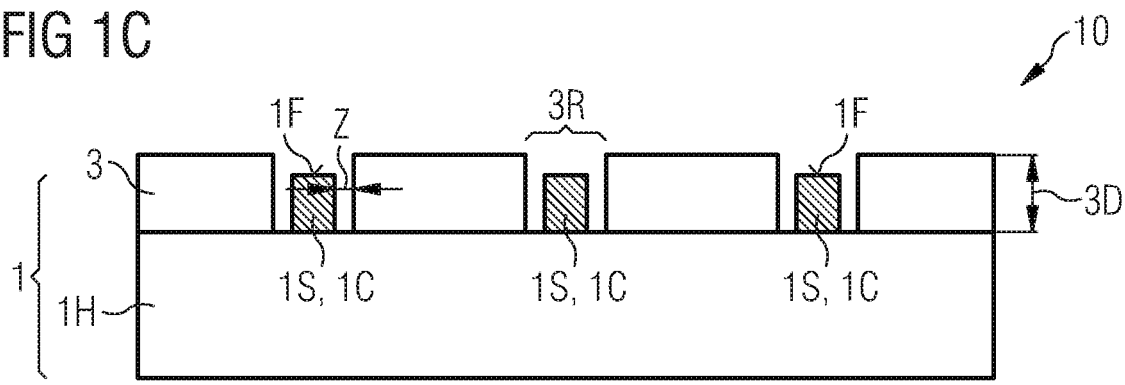

Referring to FIG. 1C, a plurality of openings 3R are formed in the bonding layer 3 for exposing the connection columns 1C and/or the connection surfaces 1F. In particular, the connection columns 1C are exposed such that the connection columns 1C are each laterally spaced apart from the bonding layer 3 by an intermediate region Z. In FIG. 1C, the bonding layer 3 extends vertically away from the main body 1H and beyond the connection surfaces 1F.

Preferably, the bonding layer 3 comprises photoactive ingredients, in particular photostructurable ingredients, so that the bonding layer 3 can be photo-structured for forming the opening or the openings 3R. The bonding layer 3 may comprise a photoresist having adhesive ingredients mixed therein. Alternatively, it is possible that material of the bonding layer 3 is mechanically or chemically removed to form the opening or the openings 3R. In particular, when the connection surfaces 1F are exposed, the vertical layer thickness 3D of the bonding layer 3 remains unchanged.

For the processing of the bonding layer 3, for example in the form of an adhesive layer, moderate baking steps may be desirable, in particular for the partial expulsion of solvent ingredients. It is also possible that, in addition to the openings 3R, surfaces of the bonding layer 3 which are not intended for subsequent occupation by component parts are also exposed. For example, a circumferential frame around the associated connection surface 1F is formed from the bonding layer 3. The circumferential frame is preferably continuous, but may also be interrupted.

The carrier 1 has a main extension surface or a receiving surface, which is formed, for example, by a surface, in particular by a planar surface, of the main body 1H of the carrier 1 facing the connection layer 1S. The bonding layer 3 may have an exposed adhesive surface, wherein the adhesive surface preferably is plane-parallel to the receiving surface of the carrier 1. In particular, the adhesive surface is formed by exposed surfaces of the bonding layer 3. The adhesive surface may be continuous or may comprise a plurality of separate partial adhesive surfaces. Preferably, the adhesive surface or the entire adhesive surface is flat. In particular, the provided adhesive surface of the bonding layer 3 is vertically elevated relative to the connection surfaces 1F, in particular elevated by a vertical distance D. If a component part 1 is arranged on the adhesive surface and the component part 1 does not extend into the opening 3R of the bonding layer 3, the component part 1 may initially be spatially spaced from the connection surface 1F by the vertical distance D (FIG. 1E).

Figure 1D:
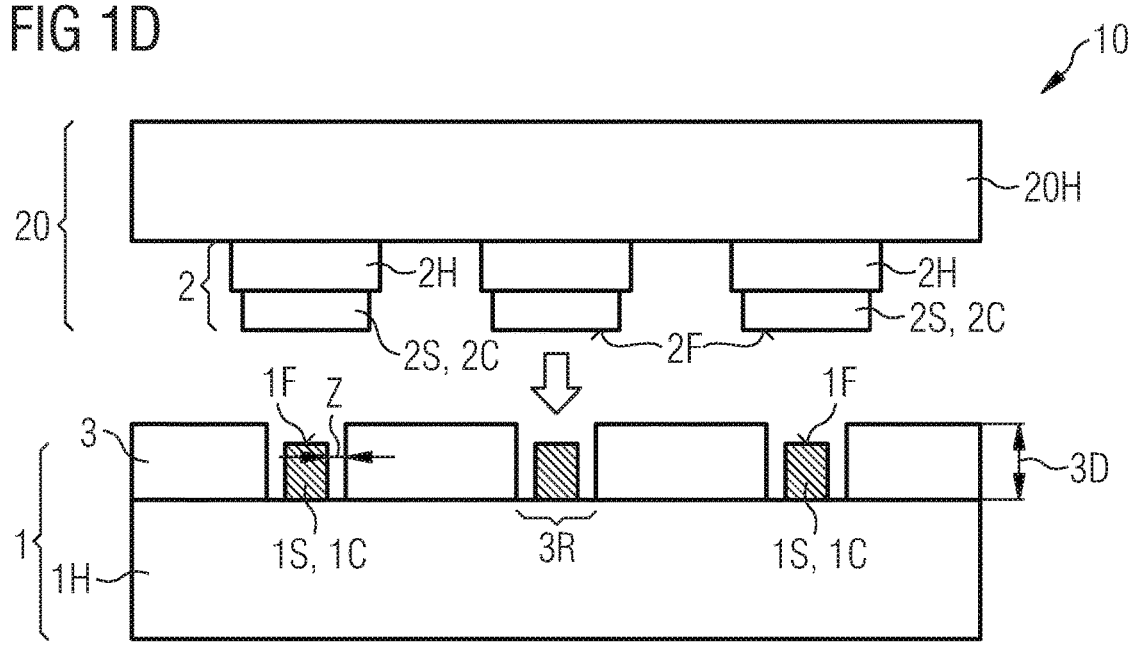
Figure 1E:
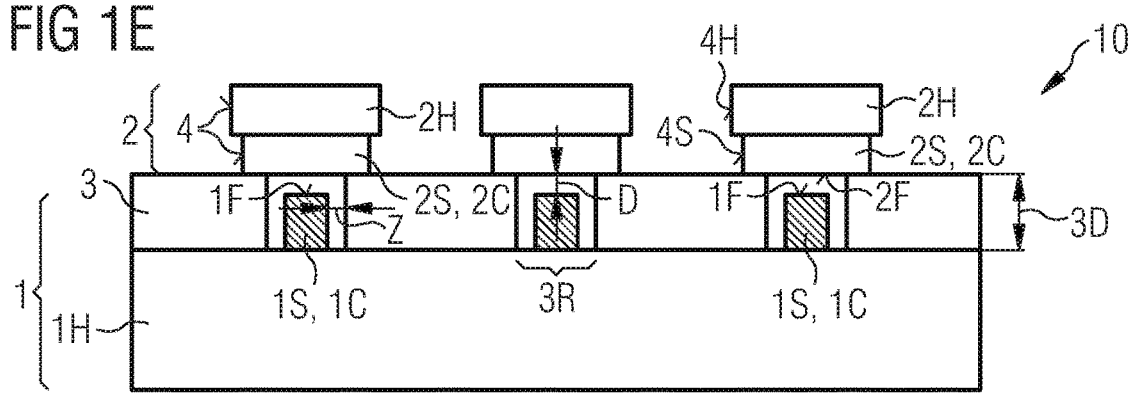

Referring to FIG. 1D, a component part 2 or a component composite 20 comprising a plurality of component parts 2 is placed on the bonding layer 3. For example, a component part 2 or a plurality of component parts 2 is placed on the bonding layer 3 using an adherent stamp 20H. The stamp 20H may be subsequently removed before or after the component part 2 or plurality of component parts 2 is permanently fixed to the carrier 1 by the bonding layer 3. It is possible that the component composite 20 comprises a plurality of component parts 2 and a common substrate 20H, wherein the component parts 2 are arranged or formed on the substrate 20H. The substrate 20H may be a growth substrate on which the main bodies 2H of the component parts 2 are epitaxially grown. After the component parts 2 have been mechanically fixed to the carrier 1, the substrate 20H may remain on the component part 2 or component parts 2 or may be removed from the component parts 2.

Referring to FIG. 1D, each component part 2 has a main body 2H, which may be a semiconductor body, and a contact layer 2S, wherein the component part 2 is disposed on the bonding layer 3 such that the contact layer 2S faces the connection layer 1S of the carrier 1. The contact layer 2S of the component part 2 may be in the form of a single contact column 2C. It is also possible that the contact layer 2S comprises at least two or exactly two contact columns 2C which are, for example, associated with different electrical polarities of the component part 2 and are provided for electrically contacting the component part 2.

In a top view of the carrier 1, the main body 2H may completely cover the contact layer 2S. In particular, the contact layer 2S or the contact column 2C comprises an exposed and thus freely accessible contact surface 2F. In particular, the contact layer 2S or the contact surface 2F is located on a rear side of the component part 2, i.e. on a side of the component part 2 facing the carrier 1.

According to FIG. 1E, the component part 2 or a plurality of component parts 2 is placed on the adhesive surface of the bonding layer 3. The bonding layer 3 is located for instance exclusively between the main body 1H of the carrier 1 and the component parts 2 or the main bodies 2H of the component parts 2. The component part 2 has side surfaces 4 which are composed in particular of side surfaces 4H of the main body 2H and of side surfaces 4S of the contact layer 2S. It is possible that the side surfaces 4H and/or the side surfaces 4S are free of being covered or free of being laterally enclosed by the bonding layer 3 before and/or after the change in volume of the bonding layer 3. In particular, the bonding layer 3 does not have a single sub-region extending along the vertical direction from the carrier 1 via the contact layer 2 to the side surfaces 4H of the main body 2H or beyond. Thus, the side surfaces 4, 4S and 4H extending along the vertical direction may be free from being covered by the material of the bonding layer 3.

In FIG. 1E, in a top view of the carrier 1, the component part 2 completely covers the opening 3R of the bonding layer 3 and the connection column 1C arranged in the opening 3R. In particular, the component parts 2 are arranged on the bonding layer 3 in an adjusted manner such that in a top view of the carrier 1, the contact surface 2F of the respective component part 2 overlaps with a connection surface 1F of the carrier 1. Along the vertical direction, the contact surface 2F is spatially separated from the connection surface 1F by a vertical distance D. In other words, there is a gap between the conductive structures at the bottom of the component parts 2 and the conductive structures at the top of the carrier 1. After arranging the component parts 2 on the bonding layer 3, the component parts 2 are temporarily mechanically connected to the carrier 1 by the bonding layer 3. However, the component parts 2 are not yet electrically conductively connected to the carrier 1.

Figure 1F:
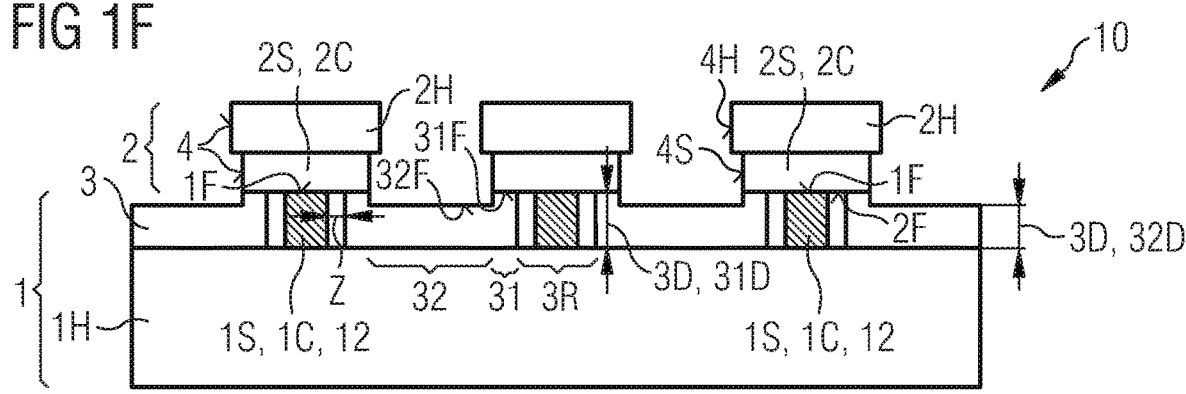

In the further course of the method, the gap is closed by reducing the vertical distance D according to FIG. 1F in such a way that the contact surface 2F and the connection surface 1F are in direct contact and form an electrical contact. A through-contact 12 is thus formed which extends throughout the bonding layer 3 and electrically connects the component part 2 to the carrier 1. According to FIG. 1F, the through-contact 12 is formed exclusively by the connection column 1C.

In particular, the volume or the layer thickness 3D of the bonding layer 3 is shrunk. The shrinkage of the bonding layer 3 is initiated, for example, by a thermal or thermomechanical process. Suitably, the layer thickness 3D is reduced or shrunk by at least the vertical distance D between the contact surface 2F and the connection surface 1F.

After the change in volume of the bonding layer 3, the latter comprises at least a first sub-region 31 which, in top view of the carrier 1, is completely covered by the associated component part 2, in particular by the main body 2H and/or by the contact layer 2S of the associated component part 2. In particular, the first sub-region 31 is the region of the bonding layer 3 which, in top view, is directly adjacent to both the carrier 1 and the component part 2. The first sub-region 31 has a surface 31F which forms for instance a joining surface between the first sub-region 31 and the component part 2. In particular, the surface 31F marks the highest vertical elevation of the bonding layer 3 in the vicinity of the associated component part 2. In the FIG. 1F, the opening 3R is enclosed, in particular completely enclosed, in the lateral directions by such a sub-region 31.

After the change in volume of the bonding layer 3, the latter has at least one second sub-region 32 which, in top view of the carrier 1, is at least partially or completely free from being covered by the component part 2 or by all the component parts 2 or at least free from being covered by the contact layer/s 2S. In the lateral direction, the second sub-region 32 is in particular directly adjacent to the first sub-region 31. The second sub-region 32 is for instance that region of the bonding layer 3 which is not directly adjacent to any component part 2 along the vertical direction, and thus has no common joining surface with any component part 2.

Figure 2A:
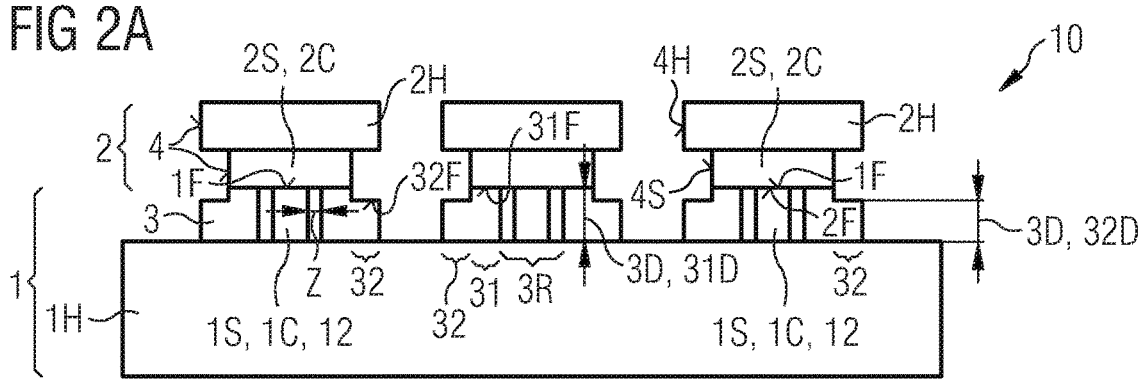
FIGS. 2A, 2B, 2C and 2D show schematic illustrations of some further method steps of a method for producing a component.

In a plan view of the carrier 1, the second sub-region 32 is located at least in part laterally of the component part 2 or of the component parts 2. However, it is possible for the second sub-region 32 to be partially or completely covered by the component part 2 (FIG. 2A). However, the second sub-region 32 is not directly adjacent to the component part 2 and may be spaced apart by a vertical distance from the component part 2, in particular from the main body 2H of the component part 2. In particular, the first sub-region 31 is partially or completely enclosed by the second sub-region 32 in the lateral directions.

The second sub-region 32 has a surface 32F facing away from the carrier 1, which is slightly recessed in the direction of the carrier 1 compared with the surface 31F of the first sub-region 31. In other words, the surface 31F of the first sub-region 31 projects along the vertical direction beyond the surface 32F of the second sub-region 32. The surfaces 31F and 32F thus form two vertically offset terraces of a step on the overall surface of the bonding layer 3, wherein the higher terrace is immediately adjacent to the component part 2 and the lower terrace is vertically spaced from the component part 2 or at least from the main body 2H of the component part 2.

The first sub-region 31 has a first layer thickness 31D and the second sub-region 32 has a second layer thickness 32D. In particular, the second layer thickness 32D is smaller than the first layer thickness 31D. Both the first layer thickness 31D and the second layer thickness 32D are smaller than the initial layer thickness 3D of the bonding layer 3. The difference between the initial layer thickness 3D and the first layer thickness 31D or the second layer thickness 32D is for instance at least as large as or larger than the initial vertical distance D between the connection surface 1F and the contact surface 2F. For example, the initial vertical distance D is shown schematically in FIG. 1E.

According to FIG. 1E, the bonding layer 3 has a globally constant layer thickness 3D before the change in volume.

After the change in volume, the bonding layer 3 has different layer thicknesses 31D and 32D in different sub-regions 31 and 32 (FIG. 1F). This fact is due, inter alia, to the fact that in virtue of direct wetting at the component part 2, after the contact surface 2F has come into contact with the connection surface 1F, the first sub-region 31 is not shrunk as much as the second sub-region 32 which is not directly adjacent to the component part 2 and is therefore not directly wetted by the component part 2. It is therefore possible that the first sub-region 31 has a lower material density than the second sub-region 32, even if the first sub-region 31 and the second sub-region 32 have the same material composition.

The different layer thicknesses 31D and 32D, the different material densities in the sub-regions 31 and 32, and the vertical offset between the surfaces 31F and 32F can therefore be regarded as characteristic features of a method wherein an electrical connection between two metal surfaces, namely between the contact surface 2F and the connection surface 1F, is formed by the change in volume in particular of an electrically non-conducting bonding layer 3.

Further characteristic features of such a method can be taken from FIGS. 1E and 1F, wherein it is schematically shown that the through-contact 12 or the connection column 1C is already laterally spaced apart from the bonding layer 3 by an intermediate region Z before and, in particular, also after the change in volume of the bonding layer 3. The intermediate region Z is in particular a cavity filled with a gaseous medium, for instance air. In the lateral directions, the through-contact 12 may be completely surrounded by the intermediate region Z.

For the sake of clarity, only the fixing and electrical contacting of one component part 2 is often described. As schematically shown in FIGS. 1D to 1F, several component parts 2 may also be mechanically fixed to and electrically contacted with the carrier 1 in the same process. For this purpose, the bonding layer 3 may comprise a plurality of openings 3R, wherein each of the component parts 2 is arranged on one of the openings 3R and being electrically connected to the carrier 1 by at least one through-contact 12 arranged in the associated opening 3R.

According to FIG. 2A, the bonding layer 3 may optionally be removed in the second sub-regions 32 laterally of the component parts 2, for example by an etching process, for example using O2 plasma. The removal of the bonding layer 3 below the component part 2 or below the component parts 2 may be neglected, so that the second sub-regions 32 are not removed at least in these regions. Referring to FIG. 2A, the bonding layer 3 is singulated into a plurality of separate sub-layers, wherein each of which sub-layers may be uniquely associated with one of the component parts 2. In top view of the carrier 1, the component part 2 may partially or completely cover its associated sub-layer of the bonding layer 3. Each of the sub-layers of the bonding layer 3 may comprise a first sub-region 31 having a layer thickness 31D and a surface 31F, and a second sub-region 32 having a layer thickness 32D and a surface 32F.

Encapsulation, passivation and/or further contact layers may be formed for further processing of the component 10 or component parts 2. Once the bonding layer 3 is at least partially removed in the second sub-regions 32, the encapsulation or passivation of the individual component parts 2 can be carried out in a simplified and reliable manner. For example, the side surfaces 4 of the component parts 2, in particular the side surfaces 4H and/or 4S, are completely encapsulated or passivated with an electrically insulating layer. Also, out-coupling structures or further optical components for beam shaping can be formed or placed on the main bodies 2H, for example.

Figure 2B:
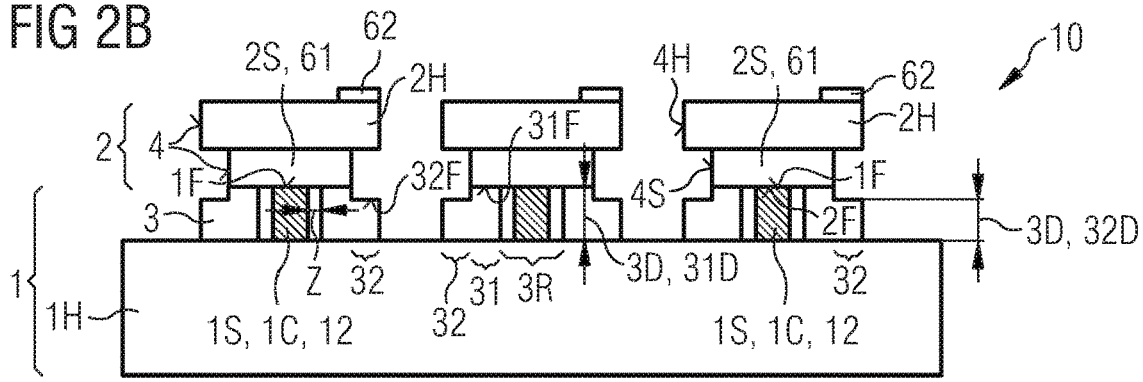

The exemplary embodiment shown in FIG. 2B is substantially the same as the exemplary embodiment of a component 10 shown in FIG. 2A. In contrast, further contact layers on the main bodies 2H are explicitly shown. For example, the contact layer 2S on the rear side of the component part 2 forms a first electrical contact point 61. In particular, the further contact layer on the front side of the component part 2 forms a second electrical contact point 62 of the component part 2. The component part 2 can be electrically contacted externally via the first electrical contact point 61 and the second electrical contact point 62. Deviating from FIG. 2B, the main body 1H of the carrier 1 may comprise through-vias extending throughout the main body 1H, so that the through-contacts 12 can be electrically contacted via these through-vias at a rear side of the carrier 1.

Figure 2C:
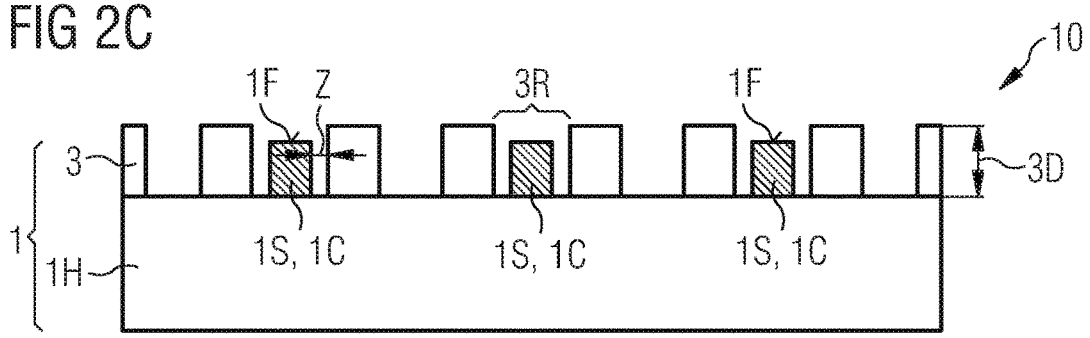
Figure 2D:
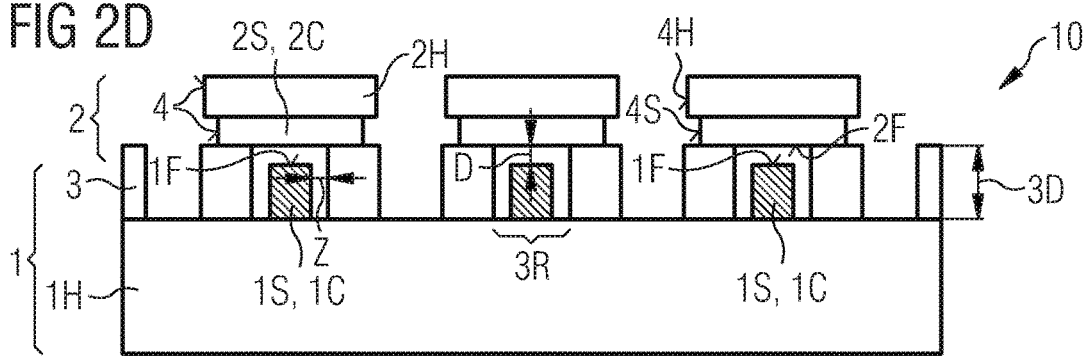

The exemplary embodiment of a method step shown in FIG. 2C essentially corresponds to the exemplary embodiment shown in FIG. 1C. In contrast to this, regions of the bonding layer 3 which are not configured for later occupation by component parts 2 are left free. The bonding layer 3 can thus already be separated into a plurality of separate sub-layers before the component parts 2 are arranged. Each of the sub-layers may have an opening 3R and is configured to receive, for example, one of the component parts 2. According to FIG. 2D, the component parts 2 are arranged on the openings 3R of the bonding layer 3. After the volume reduction of the bonding layer 3, a component 10 can be produced, which is shown for example in FIG. 2A or 2B.

The exemplary embodiments illustrated in FIGS. 3A, 3B, 3C and 3D substantially correspond to the exemplary embodiments illustrated in FIGS. 1D, 1E, 1F and 2A, respectively, for various method steps for producing a component 10. In contrast thereto, the contact layer 2S of the respective component part 2 is in the form of a contact column 2C, wherein the dimension of the contact column 2C is selected such that it projects into the opening 3R when the component part 2 is placed on the bonding layer 3. The contact layer 2S is thus not directly adjacent to the bonding layer 3, but is laterally spaced therefrom.

Figure 3A:
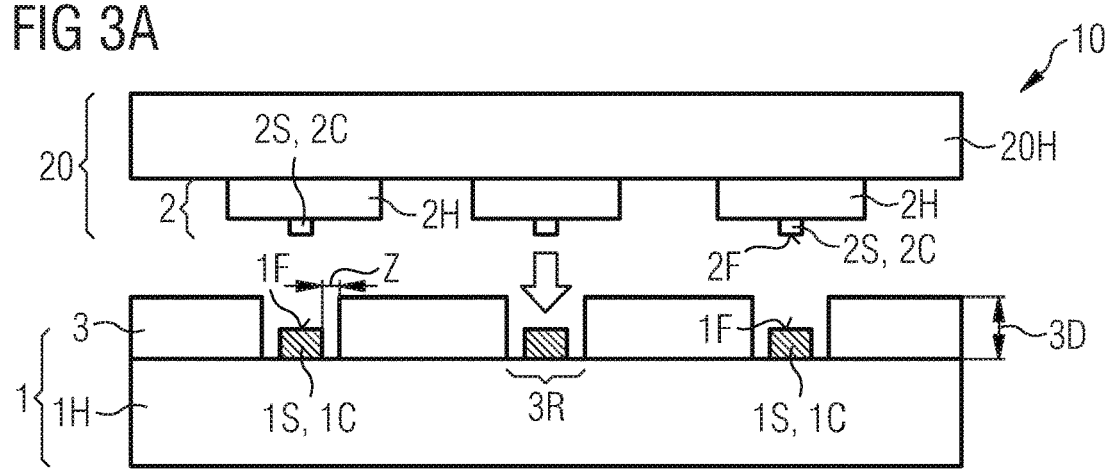
Figure 3B:
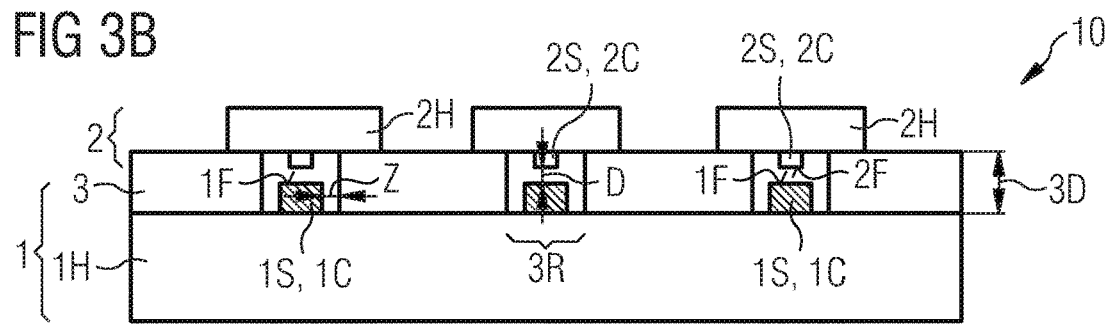

In contrast, according to FIG. 3B, the main body 2H of the component part 2 is directly adjacent to the bonding layer 3. In lateral directions, the contact layer 2S, in particular the contact column 2C, is enclosed by the bonding layer 3. It is possible that the contact layer 2S is located entirely within the opening 3R. In FIG. 3B, it is shown that the contact surface 2F is smaller than the connection surface 1F. By increasing a contact pressure during shrinkage of the bonding layer 3, a more subtle connection between the conductive structures of the component part 2 and the carrier 1 can be formed. In addition, smaller topography steps on the connection surface 1F or on the contact surface 2F can be over-formed. Conversely, it is possible that the contact surface 2F is formed larger than the connection surface 1F.

Figure 3C:
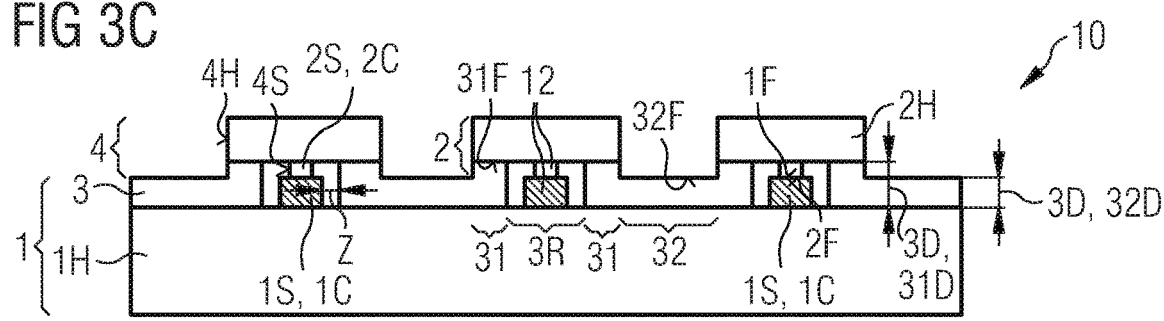

After the volume reduction of the bonding layer 3, a through-contact 12 is formed by the contact column 2C and by the connection column 1C (FIG. 3C). Due to the different cross-sections of the contact column 2C and the connection column 1C, the through-contact 12 may be formed in the form of a column having abruptly changing cross-sections. In other words, the through-contact 12 has side surfaces having the shape of a step in some regions, with a step transition being located at a boundary region between the contact column 2C and the connection column 1C. The contact column 2C and the connection column 1C may be formed from the same material or from different materials. Accordingly, the through-contact 12 may be formed from the same material throughout or from different materials in its different sub-regions.

Figure 3D:
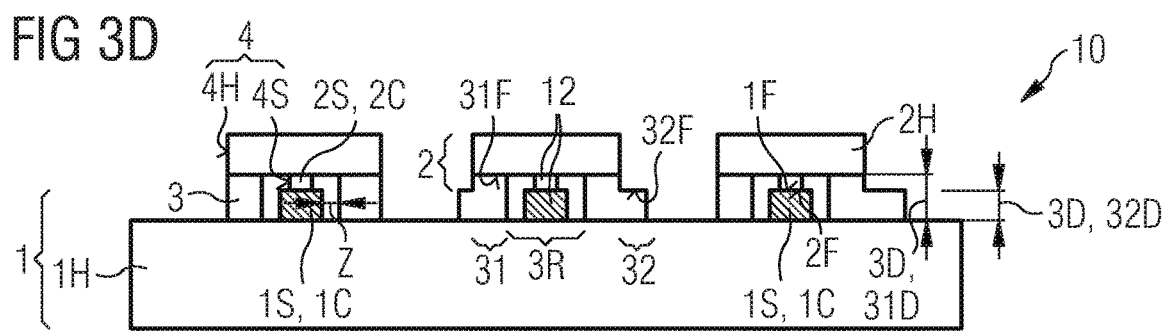
Figure 6A:
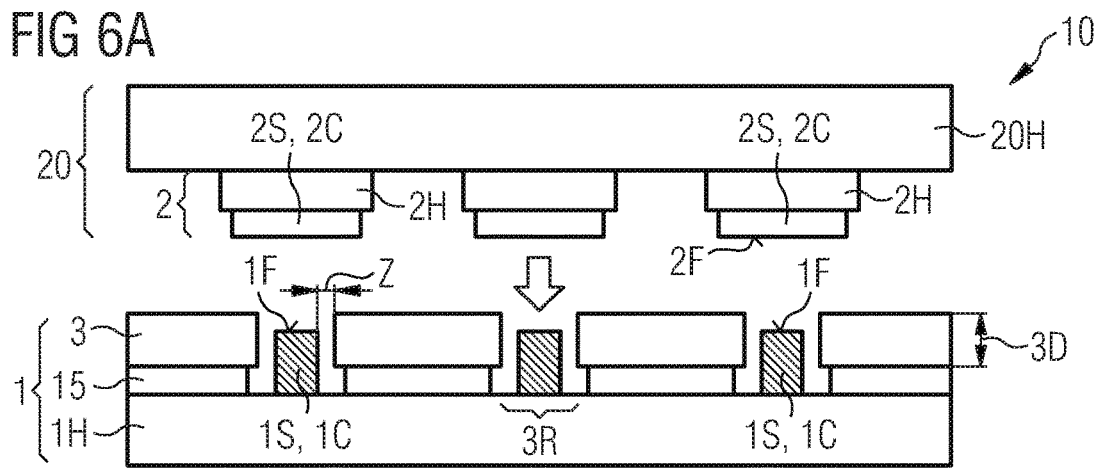
Figure 6B:
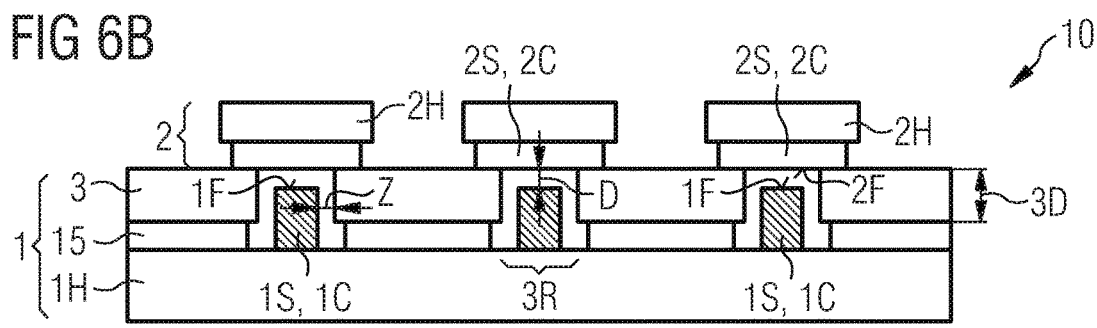
Figure 6C:
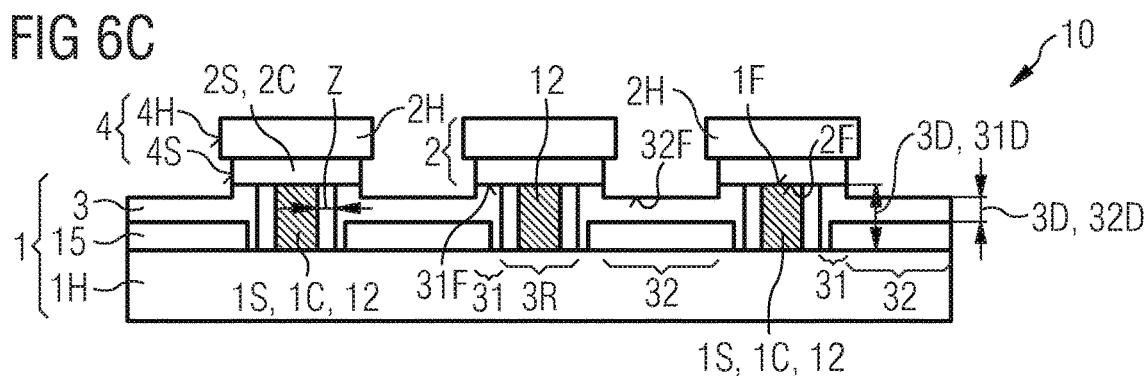
Figure 6D:
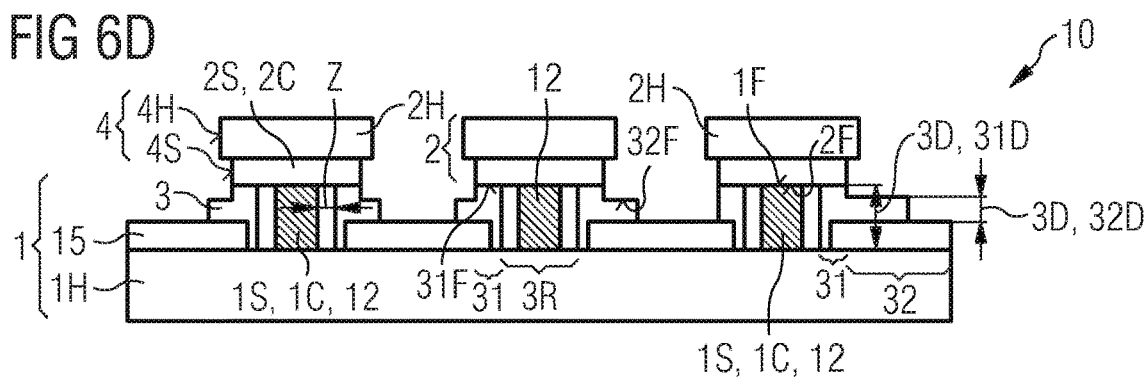

According to FIG. 3D, the component part 2 may partially or completely cover a sub-layer of the bonding layer 3. If the component part 2 completely covers the sub-layer, the sub-layer is in particular formed exclusively by the first sub-region 31 of the bonding layer 3. If the component part 2 partially covers the sub-layer, the sub-layer may be formed by a first sub-region 31 and a second sub-region 32 of the bonding layer 3, wherein in top view, the first sub-layer 31 is completely covered by to the main body 2H of the component part 2 and is directly adjacent to the main body 2H of the component part 2. In top view, the second sub-region 32 is located exclusively to the side of the main body 2H, wherein the second sub-region 32 is immediately adjacent to the first sub-region 31 and has a reduced layer thickness 32D compared with the sub-region 31.

The exemplary embodiments illustrated in FIGS. 4A, 4B, 4C and 4D are substantially the same as the exemplary embodiments illustrated in FIGS. 1D, 1E, 1F and 2A, respectively, showing various method steps for producing a component 10. In contrast, the contact surface 2F has additional topography steps, wherein the topography steps may be formed by structuring the contact surface 2F or by forming one or more spikes on the contact surface 2F. The topography step or steps extend into the opening 3R.

Such topography steps or spikes can reliably establish electrical contact between the contact surface 2F and the connection surface 1F, wherein the topography steps can be deformed when the contact surface 2F and the connection surface 1F are brought together. Due to force concentration, although a small step or spike is advantageous, it is possible that the additional topography steps are formed by a plurality of punctate or linear structures on the contact surface 2F.

The exemplary embodiments illustrated in FIGS. 5A, 5B, 5C and 5D substantially correspond to the exemplary embodiments illustrated in FIGS. 1D, 1E, 1F and 2A, respectively, showing various method steps for producing a component 10. In contrast thereto, the component parts 2 are arranged offset on the bonding layer 3 in such a way that the component parts 2 each cover one of the openings 3R only regionally. Thus, it is possible that the connection column 1C is only partially covered by the associated contact column 2C in top view, or vice versa. The contact regions of the component parts 2 are thus selectively laterally displaced.

The exemplary embodiments shown in FIGS. 6A, 6B, 6C and 6D are substantially the same as the exemplary embodiments shown in FIGS. 1D, 1E, 1F and 2A, respectively, which show various method steps for producing a component 10. In contrast, the carrier 1 has an insulating layer 15 arranged in the vertical direction between the main body 1H of the carrier 1 and the bonding layer 3. In particular, the bonding layer 3 is directly adjacent to the insulating layer 15. The bonding layer 3 and the insulating layer 15 have a plurality of common openings 3R, in each of which a connection surface 1F is accessible or a connection column 1C of the connection layer 1S is arranged.

After reducing the volume of the bonding layer 3, and possibly after optionally removing some sub-regions 32 of the bonding layer 3, the insulating layer 15 may remain in the component 10. The insulating layer 15 may facilitate the passivation or encapsulation of the component parts 2 or of the component 10, in particular if the passivation or encapsulation is carried out in large portions along the periphery of the component parts and/or also in the regions under the component parts 2. In particular, all edges of the component parts 2 or of the component 10 can thereby be safely covered by a passivation layer or by an encapsulation layer.

The exemplary embodiments illustrated in FIGS. 7A, 7B, 7C and 7D substantially correspond to the exemplary embodiments illustrated in FIGS. 6A, 6B, 6C and 6D, respectively, which show various method steps for producing a component 10. In contrast thereto, only the attachment of a single component part 2 with two rear contact points 61 and 62 is illustrated schematically. Deviating therefrom, it is possible that several such component parts 2 are fixed to the carrier 1 and electrically contacted. The contact points 61 and 62 may be configured to make electrical contact with the component part 2 and may be associated with different electrical polarities of the component part 2. It is also possible that the contact points 61 and/or 62 are configured to form one signal path or more signal paths for integrated circuits.

In a top view of the carrier 1, the component part 2 covers two openings 3R, with a connection surface 1F exposed in each opening 3R. As shown in FIG. 7A, the insulating layer 15 is disposed between the main body 1H of the carrier 1 and the connection layer 1S. The connection surface 1F or the connection layer 1S may have sub-regions which, when viewed from above on the carrier 1, are covered by or partially embedded in the bonding layer 3.

Referring to FIGS. 7C and 7D, the bonding layer 3 may comprise a second sub-region 32 having a layer thickness 32D which, in top view of the carrier 1, is arranged between the contact points 61 and 62 and is completely covered by the component part 2 and vertically spaced therefrom. In particular, the bonding layer 3 is directly adjacent to the component part 2 exclusively in the regions of the contact layer 2S. For example, the main body 2H of the component part 2 does not have a single location which is directly adjacent to the bonding layer 3.

Referring to FIG. 7D, the bonding layer 3 can be removed to partially expose the connection layer 1S. The associated component part 2 can be electrically contacted externally via the exposed regions of the connection layer 1S.

Figure 8A:
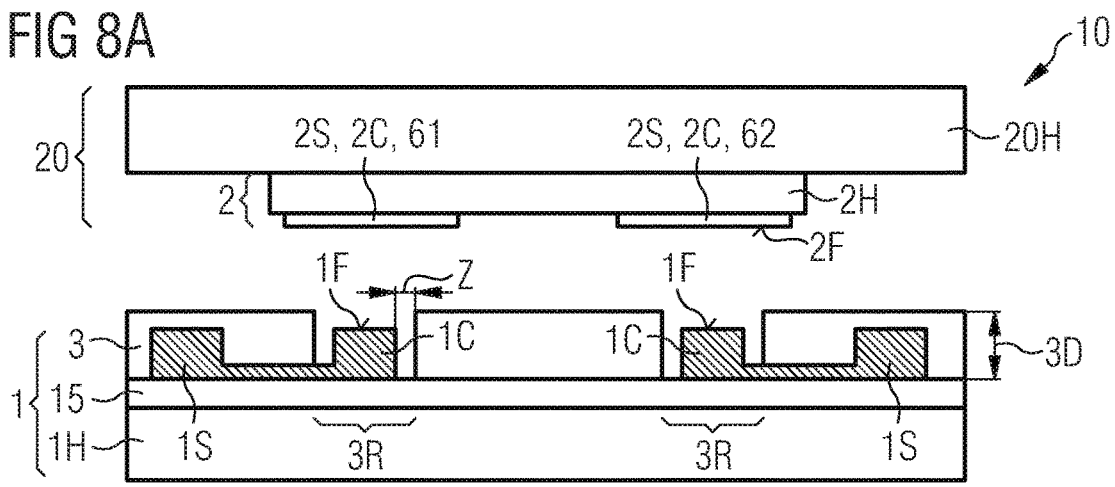
Figure 8B:
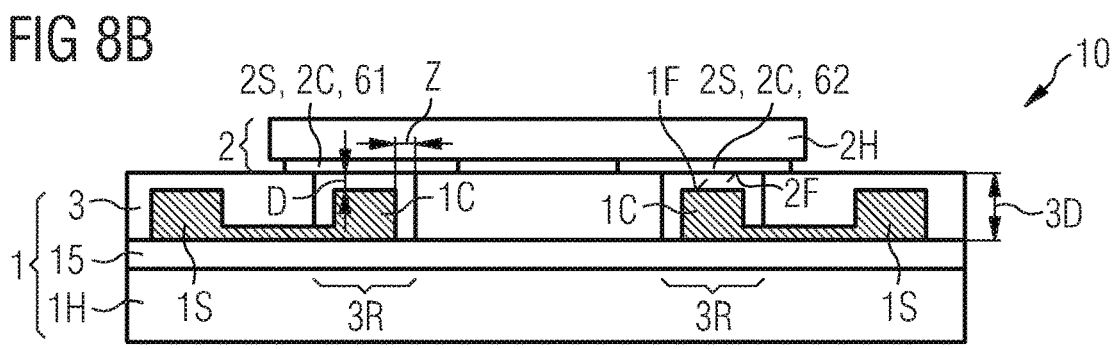
Figure 8C:
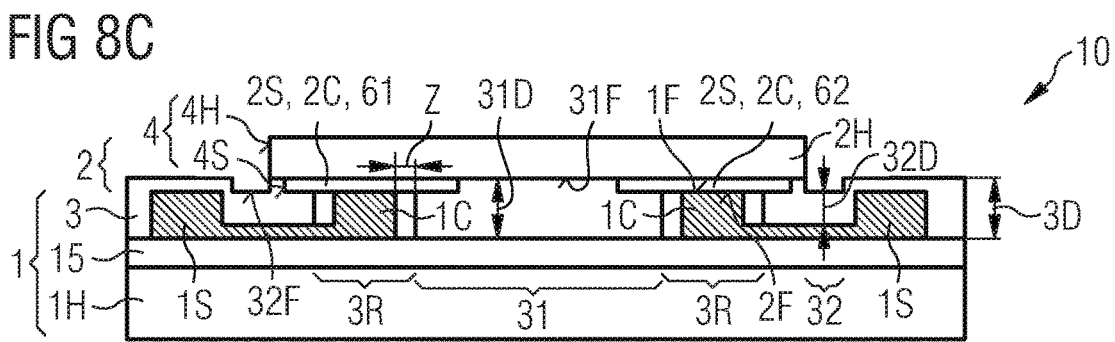
Figure 8D:
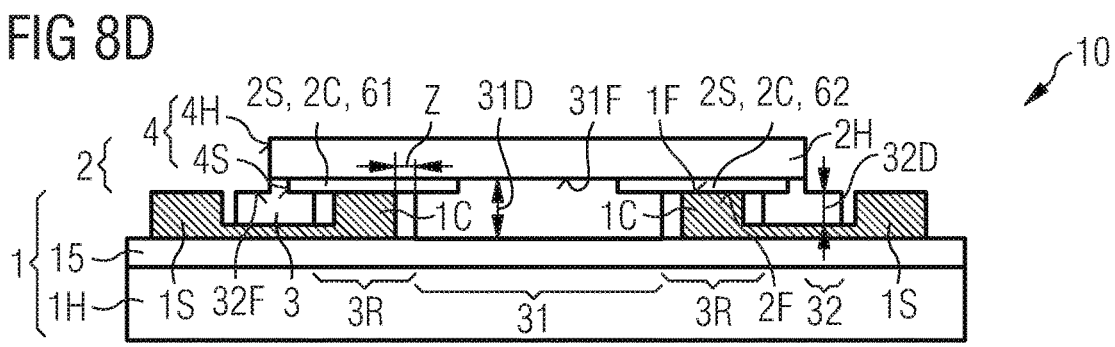

The exemplary embodiments illustrated in FIGS. 8A, 8B, 8C and 8D are substantially the same as the exemplary embodiments illustrated in FIGS. 7A, 7B, 7C and 7D, respectively, which show various method steps for producing a component 10. In contrast thereto, the bonding layer 3 is directly adjacent to both the contact layer 2S and the main body 2H of the component part 2. For example, during the volume reduction of the bonding layer 3, the component part 2 is pressed into the bonding layer 3 in such a way that the main body 2H, which according to FIG. 8B is still spatially spaced from the bonding layer 3, now comes into contact with the bonding layer 3 according to FIG. 8C and thus directly adjoins the latter.

The exemplary embodiments illustrated in FIGS. 9A, 9B, 9C and 9D are substantially the same as the exemplary embodiments illustrated in FIGS. 3A, 3B, 3C and 3D, respectively, which show various method steps for producing a component 10. In contrast, the connection layer 1S is formed in an unstructured and continuous manner. The connection layer 1S may be partially embedded in the main body 1H of the carrier 1. Along the vertical direction, a front surface of the connection layer 1S may be flush with a front surface of the main body 1H of the carrier 1.

Figure 10A:
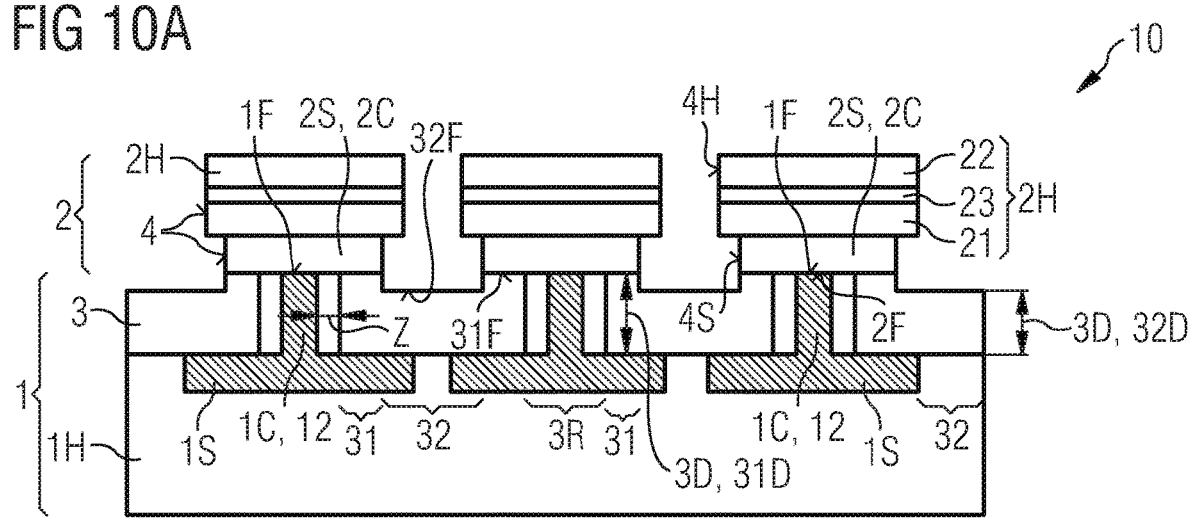
FIGS. 10A, 10B, and 10C show schematic illustrations of some exemplary embodiments of a component.

The exemplary embodiment of a component 10 shown in FIG. 10A is substantially the same as the component 10 shown in FIG. 1F. In contrast, FIG. 10A shows that the main body 2H of the component part 2 comprises a first semiconductor layer 21, a second semiconductor layer 22, and an active zone 23 located therebetween. The main body 2H of the component part 2 may be a semiconductor body, which in particular is configured to generate or detect electromagnetic radiation. For example, the component part 2 is a light emitting diode.

As a further difference to FIG. 1F, the connection layer 1S has a plurality of separate sub-layers partially embedded in the main body 1H of the carrier 1, wherein in each of the openings 3R, a connection column 1C projects beyond the associated sub-layer.

Figure 10B:
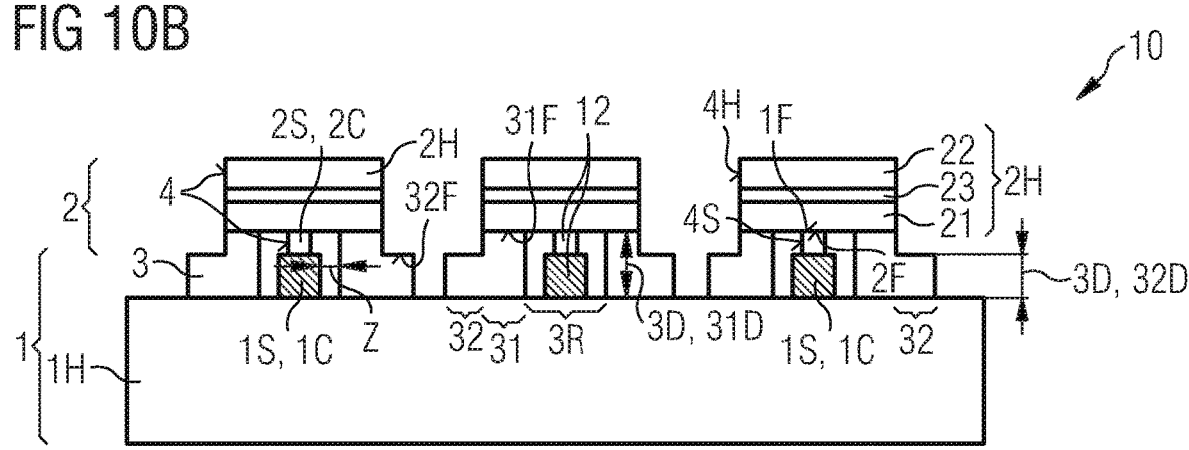

The exemplary embodiment of a component 10 shown in FIG. 10B corresponds to the component 10 shown in FIG. 3C, which includes a plurality of component parts 2 each having a main body 2H including the active zone 23 and semiconductor layers 21 and 22.

Figure 10C:
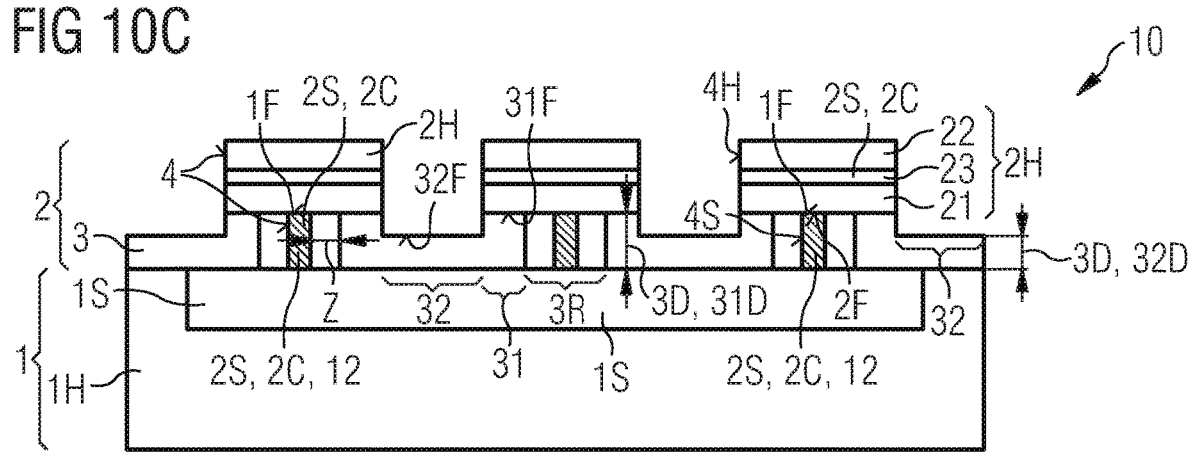

The exemplary embodiment of a component 10 shown in FIG. 10C corresponds to the component 10 shown in FIG. 9C, which includes a plurality of component parts 2 each having a main body 2H including the active zone 23 and semiconductor layers 21 and 22.

Figure 11A:
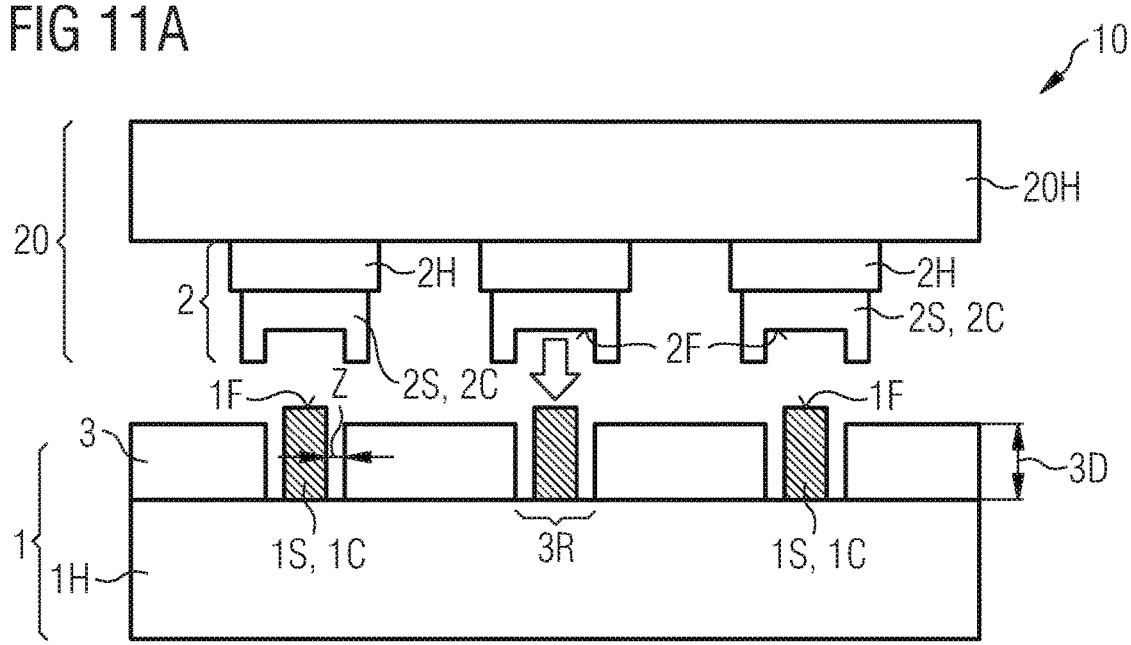
FIGS. 11A, 11B and 11C are schematic illustrations of further method steps of a further exemplary embodiment of a method for producing a component.
Figure 11B:
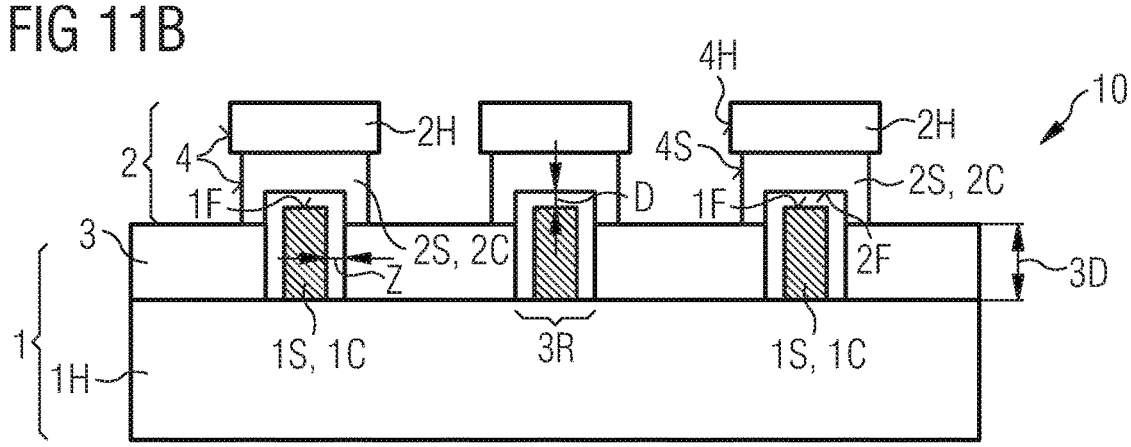
Figure 11C:
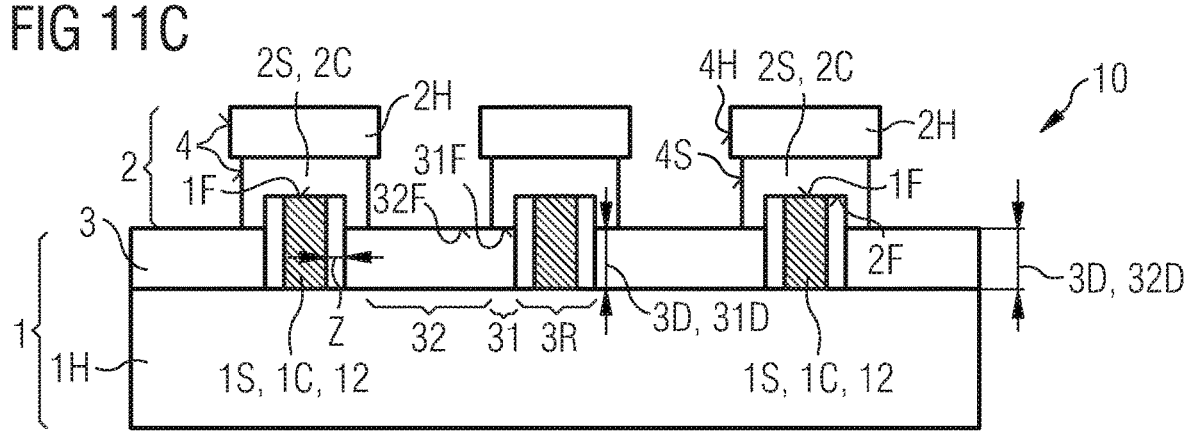

The exemplary embodiments illustrated in FIGS. 11A, 11B and 11C are substantially the same as the exemplary embodiments illustrated in FIGS. 1D, 1E and 1F, respectively, showing various method steps for producing a component 10. In contrast, the exposed connection surface 1F or the connection column 1C or the connection layer 1S protrudes beyond the bonding layer 3, namely in the direction away from the main body 1H of the carrier 1.

Referring to FIGS. 1D, 1E and 1F, the contact layer 2S may be flat. In contrast, according to FIGS. 11A, 11B and 11C, the contact layer 2S has a plurality of openings or recesses. Locally, the contact layer 2S is formed in a step-like manner. The bottom surfaces of the openings or the recesses form exposed contact surfaces 2F. The exposed connection surface 1F is located within the associated opening or depression of the contact layer 2S. In particular, the connection column 1C or the exposed connection surface 1F protrudes into the associated opening of the contact layer 2S. Along the vertical direction, the exposed connection surface 1F or the connection column 1C is spatially spaced from the contact layer 2S, in particular from the exposed contact surface 2F, by the distance D.

According to FIG. 11B, the connection layer 1S or the connection column 1C is partially or completely enclosed by the contact layer 2 and/or by the bonding layer 3 in lateral directions. In particular, if the layer thickness 3D of the bonding layer 3 is reduced, for example by shrinkage, the distance D can be reduced to zero, as a result of which the connection surface 1F is directly adjacent to the contact surface 2F. Such a component 10 is shown schematically, for example, in FIG. 11C.

In a departure from FIGS. 1C to 11C, it is possible that the lateral distance or intermediate region Z between the bonding layer 1S and the contact column 2C or the connection column 1C is not present. In this case, the bonding layer 1S may be immediately adjacent to the contact column 2C and/or immediately adjacent to the connection column 1C, either before or after reducing the layer thickness 3D of the bonding layer 3, or both before and after reducing the layer thickness 3D of the bonding layer 3.

In all exemplary embodiments, it is further possible that the electrical and mechanical connection between the connection layer 1S and the contact layer 2S is a solder connection. For example, the connection layer 1S and/or the contact layer 2S may be formed from a solder material or coated with a solder material. In this case, there may be a re-melted solder contact between the connection layer 1S and the contact layer 2S.

The invention is not restricted to the exemplary embodiments by the description of the invention made with reference to the exemplary embodiments. The invention rather comprises any novel feature and any combination of features, including in particular any combination of features in the claims, even if this feature or this combination is not itself explicitly indicated in the patent claims or exemplary embodiments.

The invention claimed is:

1. A component comprising:
    a carrier;
    at least one component part; and
    an electrically insulating bonding layer,
    wherein the component part is mechanically fixed to the carrier by the electrically insulating bonding layer,
    wherein the carrier comprises a connection layer having a connection surface,
    wherein the bonding layer is disposed on the carrier and has at least one opening in which the connection surface of the connection layer is located,
    wherein the component part comprises a contact layer having a contact surface,
    wherein, in top view of the carrier, the contact surface covers the opening of the bonding layer and the connection surface of the connection layer located therein,
    wherein the contact surface and the connection surface are directly adjacent to each other so that a direct electrical contact is formed between the contact layer and the connection layer and so that the component part is electrically conductively connected to the carrier,
    wherein, in the top view of the carrier, the bonding layer has a first sub-region and a second sub-region directly adjacent to the first sub-region,
    wherein the first sub-region has a first surface, which faces away from the carrier, which is directly adjacent to the component part and which is completely covered by the component part,
    wherein the second sub-region has a second surface which faces away from the carrier and which is not adjacent to the component part, and
    wherein a vertical distance between the first surface and a main body of the carrier is greater than the vertical distance between the second surface and the main body of the carrier.

2. A method for producing the component according to claim 1, the method comprising:
    providing the carrier, wherein the connection surface of the connection layer is exposed, and wherein the bonding layer projects vertically beyond the exposed connection surface or vice versa;
    applying the component part comprising the contact layer on the carrier such that, in the top view of the carrier, an exposed contact surface of the contact layer covers the opening and the connection surface located therein, wherein the exposed contact surface is spaced apart from the exposed connection surface by a vertical distance; and
    reducing the vertical distance by changing a volume of the bonding layer such that the exposed contact surface and the exposed connection surface are brought together such that they are directly adjacent to each other and such that the direct electrical contact is formed between the contact layer and the connection layer.

3. The method according to claim 2, wherein, after applying the component part and prior to reducing the vertical distance, the bonding layer is directly adjacent to the component part and directly adjacent to the carrier.

4. The method according to claim 2, wherein, prior to changing the volume, the bonding layer has a vertical layer thickness, and wherein reducing the vertical distance is affected by shrinking the vertical layer thickness of the bonding layer or by shrinking the volume of the bonding layer.

5. The method according to claim 4, wherein, prior to shrinking, the bonding layer is temporarily swollen for increasing an adhesiveness.

6. The method according to claim 2,
wherein, prior to changing the volume, the bonding layer in a vicinity of the contact layer has a vertical layer thickness with a constant height,
wherein, after changing the volume, the bonding layer in the same vicinity of the contact layer has a reduced vertical layer thickness with locally different heights,
wherein the layer thickness in an overlapping region of the bonding layer with the component part is greater than in a region of the bonding layer without having an overlap with the component part, or
wherein the layer thickness in an overlapping region of the bonding layer with the contact layer is greater than in a region of the bonding layer without having an overlap with the contact layer.

7. The method according to claim 2, wherein the bonding layer comprises a photostructurable material, and wherein the opening is formed by photo-structuring the bonding layer.

8. The method according to claim 2,
wherein the exposed connection surface is formed by an exposed surface of a connection column,
wherein the connection column is arranged in the opening of the bonding layer, and
wherein, prior to changing the volume, the connection column is laterally spaced from the bonding layer, and remains laterally spaced from the bonding layer after changing the volume.

9. The method according to claim 2,
wherein the exposed contact surface is formed by an exposed surface of a contact column,
wherein the contact column projects into the opening of the bonding layer, and
wherein, prior to changing the volume, the contact column is laterally spaced from the bonding layer, and remains laterally spaced from the bonding layer after the change in the volume of the bonding layer.

10. The method according to claim 2,
wherein a plurality of component parts is mounted simultaneously on the carrier,
wherein each component part comprises a contact layer having at least one contact surface,
wherein the bonding layer has a plurality of openings in each of which a connection surface of the connection layer is freely accessible, and
wherein, while reducing the volume of the bonding layer, the component parts are electrically connected to the carrier.

11. The method according to claim 2, wherein reducing the vertical distance is mechanically supported by external force.

12. The component according to claim 1, wherein an interface between the contact layer and the connection layer is formed by an overlapping surface between the contact surface and the connection surface, and wherein the interface is free of a material of the bonding layer or free of traces of a material of the bonding layer.

13. The component according to claim 1, wherein the bonding layer extends exclusively in a vertical region located along a vertical direction at a height between the carrier and the component part so that side surfaces of a main body of the component part are free from being covered by the bonding layer.

14. The component according to claim 1, wherein the bonding layer has, in an overlapping region with the component part, a surface which faces away from the carrier, which is directly adjacent to the component part and which marks a highest vertical elevation of the bonding layer from the carrier.

15. The component according to claim 1, wherein the bonding layer is a thin adhesion promoter layer having a layer thickness of between 20 nm and 2 μm inclusive.

16. The component according to claim 1,
wherein the component part is electrically conductively connected to the carrier via a through-contact,
wherein the through-contact comprises at least a sub-region of the contact surface and at least a sub-region of the connection surface,
wherein the through-contact extends along a vertical direction throughout the bonding layer,
wherein the through-contact is spaced apart from the bonding layer in a lateral direction by an intermediate region, and
wherein the intermediate region is a cavity filled with a gaseous medium.

17. The component according to claim 1,
wherein the component part comprises a semiconductor body having an optically active zone configured to generate or detect electromagnetic radiation, and
wherein the carrier has electrical circuits configured to electrically connect with or to drive the component part.

18. The component according to claim 1, wherein, in a plan view, the contact surface of the contact layer only partially covers the opening and the connection surface.

19. The component according to claim 1, wherein a contact between the contact layer and the connection layer is a melted contact connection.

20. A component comprising:
a carrier;
at least one component part; and
an electrically insulating bonding layer,
wherein the component part is mechanically fixed to the carrier by the electrically insulating bonding layer,
wherein the carrier comprises a connection layer having a connection surface,
wherein the bonding layer is disposed on the carrier and has at least one opening in which the connection surface of the connection layer is located,
wherein the component part comprises a contact layer having a contact surface,
wherein, in top view of the carrier, the contact surface covers the opening of the bonding layer and the connection surface of the connection layer located therein,
wherein the contact surface and the connection surface are directly adjacent to each other so that a direct electrical contact is formed between the contact layer and the connection layer and so that the component part is electrically conductively connected to the carrier,
wherein the component part is electrically conductively connected to the carrier via a through-contact, wherein the through-contact comprises at least a sub-region of the contact surface and at least a sub-region of the connection surface,
wherein the through-contact extends along a vertical direction throughout the bonding layer,
wherein the through-contact is spaced apart from the bonding layer in a lateral direction by an intermediate region, and
wherein the intermediate region is a cavity filled with a gaseous medium.

* * * * *